US012648095B2

(12) United States Patent
Jang et al.

(10) Patent No.: US 12,648,095 B2
(45) Date of Patent: Jun. 2, 2026

(54) ELECTRONIC DEVICE INCLUDING SUPPORT AREA FOR SUPPORT SEALING MEMBER

(71) Applicant: SAMSUNG ELECTRONICS CO., LTD., Suwon-si (KR)

(72) Inventors: Changik Jang, Suwon-si (KR); Hyunyoung Roh, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 18/788,825

(22) Filed: Jul. 30, 2024

(65) Prior Publication Data

US 2025/0031326 A1 Jan. 23, 2025

Related U.S. Application Data

(63) Continuation of application No. PCT/KR2024/007415, filed on May 31, 2024.

(30) Foreign Application Priority Data

Jul. 21, 2023 (KR) ........................ 10-2023-0095109
Aug. 31, 2023 (KR) ........................ 10-2023-0115497

(51) Int. Cl.
*H05K 5/02* (2006.01)
*H04R 1/04* (2006.01)
(Continued)

(52) U.S. Cl.
CPC ............. *H05K 5/0217* (2013.01); *H04R 1/04* (2013.01); *H04R 1/086* (2013.01); *H05K 7/1427* (2013.01)

(58) Field of Classification Search
None
See application file for complete search history.

(56) References Cited

U.S. PATENT DOCUMENTS

2004/0029530 A1 2/2004 Noguchi et al.
2009/0245565 A1* 10/2009 Mittleman ............. H04R 1/025
381/189
(Continued)

FOREIGN PATENT DOCUMENTS

CN 108712693 A 10/2018
CN 110582042 A 12/2019
(Continued)

OTHER PUBLICATIONS

PCT International Search Report issued on Sep. 9, 2024 for PCT Application No. PCT/KR2024/007415.

*Primary Examiner* — Xanthia C Relford
(74) *Attorney, Agent, or Firm* — Nixon & Vanderhye P.C.

(57) ABSTRACT

An electronic device may include a housing forming a side surface surrounding an internal space, and including a front frame which is disposed in the internal space and forms at least a portion of the side surface, and on which a sound hole for transferring a sound from an outside of the electronic device to the internal space, and an acoustic duct communicating with the sound hole are formed, a printed circuit board (PCB) which is supported by the front frame and includes a first board surface, a second board surface, and an opening, a sound module disposed on, directly or indirectly, the first board surface to overlap the opening, and a sealing member that seals a portion between the front frame and the PCB. The front frame includes a support area supporting the sealing member along a circumferential direction of the sealing member.

20 Claims, 13 Drawing Sheets

(51) Int. Cl.
    *H04R 1/08*          (2006.01)
    *H05K 7/14*          (2006.01)

(56)           References Cited

U.S. PATENT DOCUMENTS

| | | | |
|---|---|---|---|
| 2017/0251292 A1* | 8/2017 | Wiederholtz | H04R 1/1041 |
| 2019/0342645 A1* | 11/2019 | Jung | H04R 1/345 |
| 2020/0203257 A1* | 6/2020 | Miehl | H04R 1/086 |
| 2020/0288251 A1* | 9/2020 | Kuipers | H04R 1/1041 |
| 2022/0141323 A1* | 5/2022 | Yuan | H04M 1/035 |
| | | | 455/575.1 |
| 2022/0286540 A1* | 9/2022 | Gillier | H04R 1/025 |
| 2022/0286543 A1* | 9/2022 | Hale | H04M 1/0249 |
| 2023/0007388 A1* | 1/2023 | Okazaki | H04R 1/023 |
| 2023/0283945 A1* | 9/2023 | Hu | H04R 1/023 |
| | | | 381/335 |

FOREIGN PATENT DOCUMENTS

| | | |
|---|---|---|
| KR | 10-2014-0118726 A | 10/2014 |
| KR | 10-2018-0092219 A | 8/2018 |
| KR | 10-2021-0049346 A | 5/2021 |
| KR | 10-2022-0101834 A | 7/2022 |
| KR | 20220099365 A | 7/2022 |
| KR | 20220120854 A | 8/2022 |

* cited by examiner

ELECTRONIC DEVICE INCLUDING SUPPORT AREA FOR SUPPORT SEALING MEMBER

CROSS-REFERENCE TO RELATED APPLICATIONS

This application is a continuation application of International Application No. PCT/KR2024/007415 designating the United States, filed on May 31, 2024, in the Korean Intellectual Property Receiving Office and claiming priority to Korean Patent Application No. 10-2023-0095109, filed on Jul. 21, 2023 and Korean Patent Application No. 10-2023-0115497, filed on Aug. 31, 2023, in the Korean Intellectual Property Office, the disclosures of which are incorporated by reference herein in their entireties.

BACKGROUND

1. Field

Certain example embodiments relate to an electronic device including a support area for supporting a sealing member.

2. Description of Related Art

An electronic device including a smartphone, a wearable device, a tablet personal computer (PC), and the like may include a sound module for generating sounds or accommodating sounds generated from the outside of the electronic device. The sound module may be mounted in a housing of the electronic device to emit or accommodate sounds through a sound hole formed in the housing. The electronic device may include a sealing member to waterproof the sound module or prevent or reduce introduction of foreign substances. The housing of the electronic device may have a supporting structure to prevent or reduce a damage to the sealing member during a process in which a printed circuit board (PCB) supporting the sound module is seated on, directly or indirectly, the housing.

The above description should not be construed as that the applicant has acknowledged the present disclosure as the prior art, but should only be interpreted as the related art to the invention described herein.

SUMMARY

According to example embodiments, an electronic device may include a housing forming a front surface, a rear surface opposite to the front surface, and a side surface surrounding an internal space between the front surface and the rear surface, and including a front frame which is disposed in the internal space and forms at least a portion of the side surface, and on which a sound hole for transferring a sound from an outside of the electronic device to the internal space, and an acoustic duct communicating with the sound hole are formed, a printed circuit board (PCB) which is supported by the front frame and may include a first board surface, a second board surface opposite to the first board surface, and an opening formed to penetrate the first board surface and the second board surface to overlap the acoustic duct, a sound module electrically connected to the PCB and including a microphone disposed on, directly or indirectly, the first board surface to overlap the opening, and a sealing member, comprising seal material, that seals a portion between the front frame and the PCB, and transfers a sound between the acoustic duct and the opening. The front frame may include a support area supporting the sealing member along a circumferential direction of the sealing member.

According to example embodiments, an electronic device may include a housing forming a front surface, a rear surface opposite to the front surface, and a side surface surrounding an internal space between the front surface and the rear surface, and including a front frame which is disposed in the internal space and forms at least a portion of the side surface, and on which a sound hole for transferring a sound from an outside of the electronic device to the internal space, and an acoustic duct communicating with the sound hole are formed, a PCB which is supported by the front frame and may include a first board surface, a second board surface opposite to the first board surface, and an opening formed to penetrate the first board surface and the second board surface to overlap the acoustic duct, a sound module electrically connected to the PCB and including a microphone disposed on, directly or indirectly, the first board surface to overlap the opening, and a sealing member, comprising seal material, that seals a portion between the front frame and the PCB, transfers a sound between the acoustic duct and the opening, and has an inclined shape based on a state in which the second board surface is viewed. The front frame may include a support area supporting the sealing member along a circumferential direction of the sealing member. The support area may include a first support surface formed to be inclined in a height direction of the housing from the front surface toward the rear surface of the housing, and a second support surface formed to extend from the first support surface to form a first inclination angle with the first support surface.

According to example embodiments, an electronic device may include a housing forming a front surface, a rear surface to be opposite to the front surface, and a side surface surrounding an internal space between the front surface and the rear surface, and including a front frame which is disposed in the internal space and forms at least a portion of the side surface, and on which a sound hole for transferring a sound from an outside of the electronic device to the internal space, and an acoustic duct communicating with the sound hole are formed, a PCB which is supported by the front frame and may include a first board surface, a second board surface opposite to the first board surface, and an opening formed to penetrate the first board surface and the second board surface to overlap the acoustic duct, a sound module electrically connected to the PCB and including a microphone disposed on, directly or indirectly, the first board surface to overlap the opening, and a sealing member that seals a portion between the front frame and the PCB, transfers a sound between the acoustic duct and the opening, and has an inclined shape based on a state in which the second board surface is viewed. The front frame may include a support area supporting the sealing member along a circumferential direction of the sealing member. The support area may include a first support surface formed to be inclined in a height direction of the housing from the front surface toward the rear surface of the housing, and a second support surface formed to extend from the first support surface to form a first inclination angle with the first support surface. The sealing member may include an attachment surface attached to the second board surface, a first sealing surface disposed on, directly or indirectly, the first support surface with an inclination parallel to the first support surface, and a second sealing surface formed to extend from the first sealing surface to form a second inclination angle, that is substantially the same as the first inclination angle, with the first sealing surface, and disposed on, directly or indirectly, the second support surface with an inclination parallel to the second support surface.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
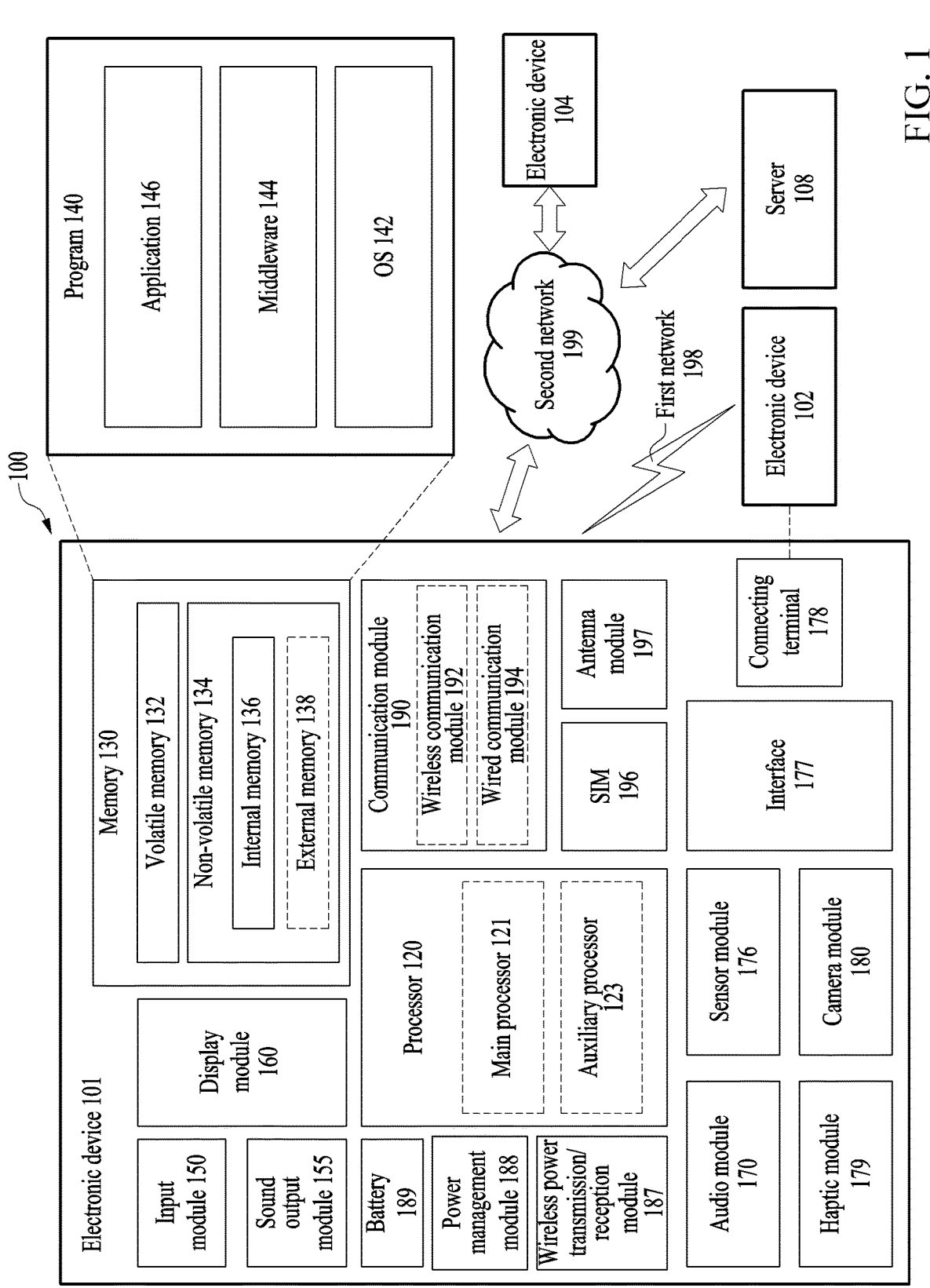
FIG. 1 is a block diagram of an electronic device in a network environment according to an example embodiment.

Hereinafter, certain example embodiments will be described in detail with reference to the accompanying drawings. When describing the embodiments with reference to the accompanying drawings, like reference numerals refer to like elements and a repeated description related thereto will be omitted.

FIG. 1 is a block diagram of an electronic device in a network environment according to an embodiment.

Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a wireless power transmission/reception module 187, a power management module 188, a battery 189, a communication module 190, a subscriber identification module (SIM) 196, or an antenna module 197. In some embodiments, at least one (e.g., the connecting terminal 178) of the above components may be omitted from the electronic device 101, or one or more other components may be added in the electronic device 101. In some embodiments, some of the components (e.g., the sensor module 176, the camera module 180, or the antenna module 197) may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an embodiment, the auxiliary processor 123 (e.g., an ISP or a CP) may be implemented as a portion of another component (e.g., the camera module 180 or the communication module 190) that is functionally related to the auxiliary processor 123. According to an embodiment, the auxiliary processor 123 (e.g., an NPU) may include a hardware structure specified for artificial intelligence (AI) model processing. An AI model may be generated by machine learning. Such learning may be performed by, for example, the electronic device 101 in which artificial intelligence is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an embodiment, the receiver may be implemented separately from the speaker or as a part of the speaker.

The display module 160 may visually provide information to the outside (e.g., a user) of the electronic device 101. The display module 160 may include, for example, a display, a hologram device, or a projector and control circuitry to control a corresponding one of the display, the hologram device, or the projector. According to an embodiment, the display module 160 may include a touch sensor adapted to sense a touch, or a pressure sensor adapted to measure an intensity of a force incurred by the touch.

The audio module 170 may convert a sound into an electric signal or vice versa. According to an embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electric signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., by wire) or wirelessly. According to an embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electric signal into a mechanical stimulus (e.g., a vibration or a movement) or an electrical stimulus which may be recognized by a user via his or her tactile sensation or kinesthetic sensation. According to an embodiment, the haptic module 179 may include, for example, a motor, a piezoelectric element, or an electric stimulator.

The camera module 180 may capture a still image and moving images. According to an embodiment, the camera module 180 may include one or more lenses, image sensors, ISPs, or flashes.

The power management module 188 may manage power supplied to the electronic device 101. According to an example embodiment, the power management module 188 may be implemented as, for example, at least a part of a power management integrated circuit (PMIC). The wireless power transmission/reception module 187 may be configured to transmit and receive power wirelessly.

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an embodiment, another component (e.g., a radio frequency integrated circuit (RFIC)) other than the radiating element may be additionally formed as a part of the antenna module 197.

According to an embodiment, the antenna module 197 may form a mmWave antenna module. According to an embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the external electronic devices 102 and 104 may be a device of the same type as or a different type from the electronic device 101. According to an embodiment, all or some of operations to be executed by the electronic device 101 may be executed at one or more external electronic devices (e.g., the external electronic devices 102 and/or 104, and the server 108). For example, if the electronic device 101 needs to perform a function or a service automatically, or in response to a request from a user or another device, the electronic device 101, instead of, or in addition to, executing the function or the service, may request one or more external electronic devices to perform at least a portion of the function or the service. The one or more external electronic devices receiving the request may perform the at least part of the function or the service requested, or an additional function or an additional service related to the request, and may transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various embodiments of the present disclosure and the terms used therein are not intended to limit the technological features set forth herein to particular embodiments and include various changes, equivalents, or replacements for a corresponding embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., by wire), wirelessly, or via at least a third element(s).

As used in connection with an embodiment of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC). Thus, each "module" herein may include circuitry.

Embodiments as set forth herein may be implemented as software (e.g., the program 140) including one or more instructions that are stored in a storage medium (e.g., an internal memory 136 or an external memory 138) that is readable by a machine (e.g., the foldable electronic device 101). For example, a processor (e.g., the processor 120) of the machine (e.g., the foldable electronic device 101) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

Each "processor" herein includes processing circuitry, and/or may include multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions.

According to an example embodiment, a method according to an example embodiment of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™), or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to an embodiment, each component (e.g., a module or a program) of the above-described components may include a single entity or multiple entities, and some of the multiple entities may be separately disposed in different components. According to various embodiments, one or more of the above-described components or operations may be omitted, or one or more other components or operations may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Figure 2:
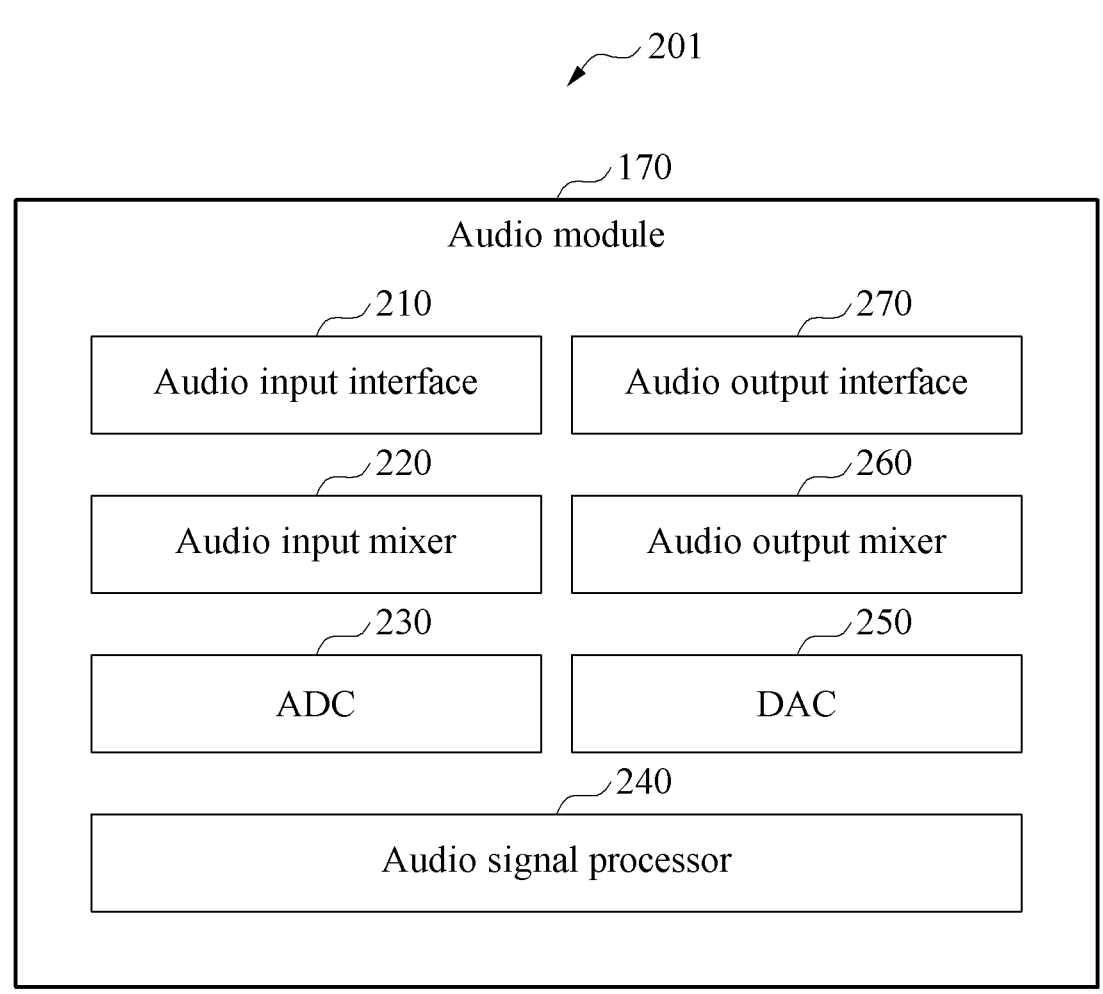
FIG. 2 is a block diagram of an audio module of an electronic device according to an example embodiment.

FIG. 2 is a block diagram of an audio module of an electronic device according to an embodiment.

Referring to FIG. 2, the audio module 170 may include an audio input interface 210, an audio input mixer 220, an analog-to-digital converter (ADC) 230, an audio signal processor 240, a digital-to-analog converter (DAC) 250, an audio output mixer 260, or an audio output interface 270.

The audio input interface 210 may receive an audio signal corresponding to a sound obtained from the outside of an electronic device 201 (e.g., the electronic device 101 of FIG. 1) via a microphone (e.g., a dynamic microphone, a condenser microphone, or a piezo microphone) that is configured as a part of the input module 150 or separately from the electronic device 201 (e.g., the electronic device 101 of FIG. 1). For example, when an audio signal is obtained from an external electronic device (e.g., the external electronic device 102 of FIG. 1, for example, a headset or a microphone), the audio input interface 210 may be connected to the external electronic device 102 directly via the connecting terminal 178, or wirelessly (e.g., Bluetooth™ communication) via the wireless communication module 192 to receive the audio signal. According to an embodiment, the audio input interface 210 may receive a control signal (e.g., a volume adjustment signal received via an input button) related to the audio signal obtained from the external electronic device 102. The audio input interface 210 may include a plurality of audio input channels and may receive a different audio signal via a corresponding one of the plurality of audio input channels, respectively. According to an embodiment, additionally or alternatively, the audio input interface 210 may receive an audio signal from another component (e.g., the processor 120 or the memory 130 of FIG. 1) of the electronic device 201.

The audio input mixer 220 may synthesize a plurality of input audio signals into at least one audio signal. For example, according to an embodiment, the audio input mixer 220 may synthesize a plurality of analog audio signals input via the audio input interface 210 into at least one analog audio signal.

The ADC 230 may convert an analog audio signal into a digital audio signal. For example, according to an embodiment, the ADC 230 may convert an analog audio signal received via the audio input interface 210 or, additionally or alternatively, an analog audio signal synthesized via the audio input mixer 220 into a digital audio signal.

The audio signal processor 240 may perform various processing on a digital audio signal received via the ADC 230 or a digital audio signal received from another component of the electronic device 201. For example, according to an embodiment, the audio signal processor 240 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to an embodiment, one or more functions of the audio signal processor 240 may be implemented in the form of an equalizer.

The DAC 250 may convert a digital audio signal into an analog audio signal. For example, according to an embodiment, the DAC 250 may convert a digital audio signal processed by the audio signal processor 240 or a digital audio signal obtained from another component (e.g., the processor 120 or the memory 130) of the electronic device 201 into an analog audio signal.

The audio output mixer 260 may synthesize a plurality of audio signals, which are to be output, into at least one audio signal. For example, according to an embodiment, the audio output mixer 260 may synthesize an audio signal converted by the DAC 250 and another analog audio signal (e.g., an analog audio signal received via the audio input interface 210) into at least one analog audio signal.

The audio output interface 270 may output an analog audio signal converted by the DAC 250 or, additionally or alternatively, an analog audio signal synthesized by the audio output mixer 260 to the outside of the electronic device 201 via the sound output module 155. The sound output module 155 may include, for example, a speaker, such as a dynamic driver or a balanced armature driver, or a receiver. According to an embodiment, the sound output module 155 may include a plurality of speakers. In such a case, the audio output interface 270 may output audio signals having a plurality of different channels (e.g., stereo channels or 5.1 channels) via at least some of the plurality of speakers. According to an embodiment, the audio output interface 270 may be connected to the external electronic device 102 (e.g., an external speaker or a headset) directly via the connecting terminal 178 or wirelessly via the wireless communication module 192 to output an audio signal.

According to an embodiment, the audio module 170 may generate, without separately including the audio input mixer 220 or the audio output mixer 260, at least one digital audio signal by synthesizing a plurality of digital audio signals using at least one function of the audio signal processor 240.

According to an embodiment, the audio module 170 may include an audio amplifier (not shown) (e.g., a speaker amplifying circuit) that is capable of amplifying an analog audio signal input via the audio input interface 210 or an audio signal that is to be output via the audio output interface 270. According to an embodiment, the audio amplifier may be configured as a module separate from the audio module 170.

Figure 3A:
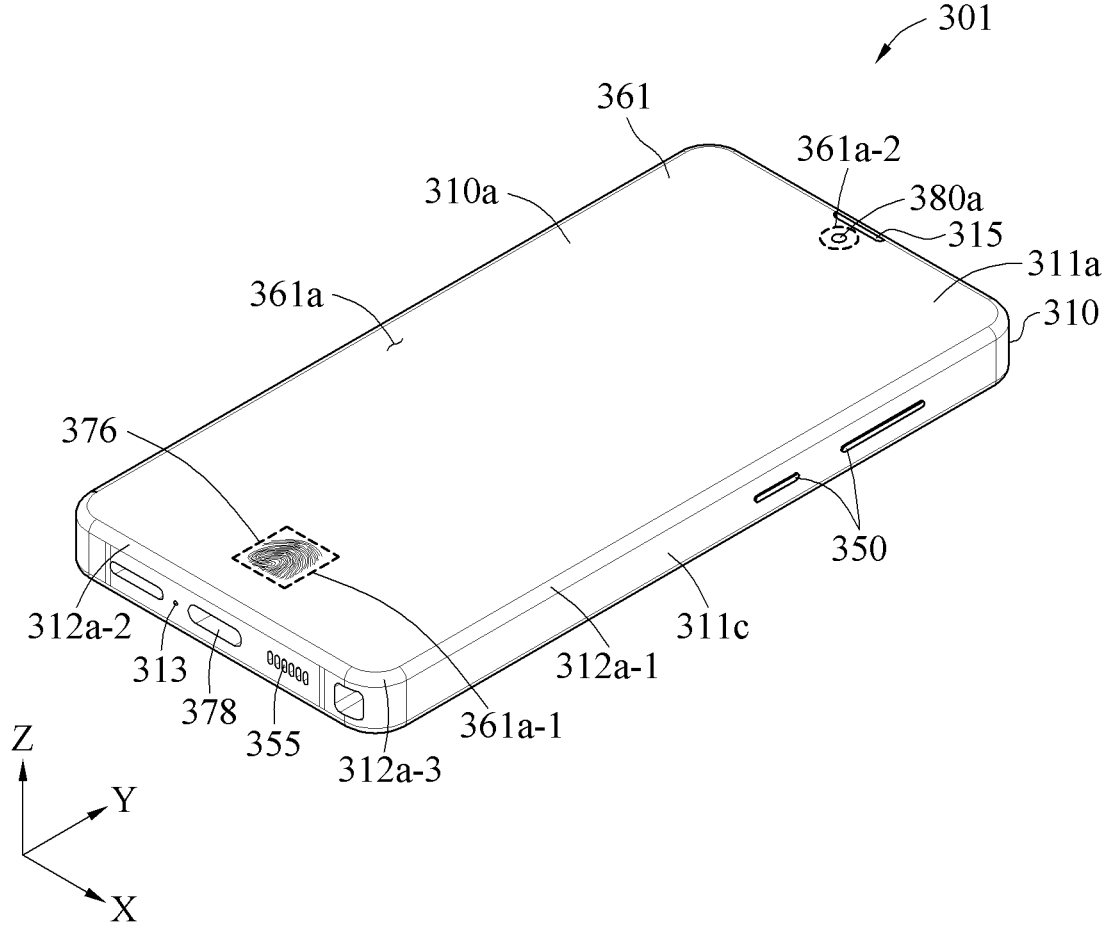
FIG. 3A is a front perspective view of an electronic device according to one example embodiment.
Figure 3B:
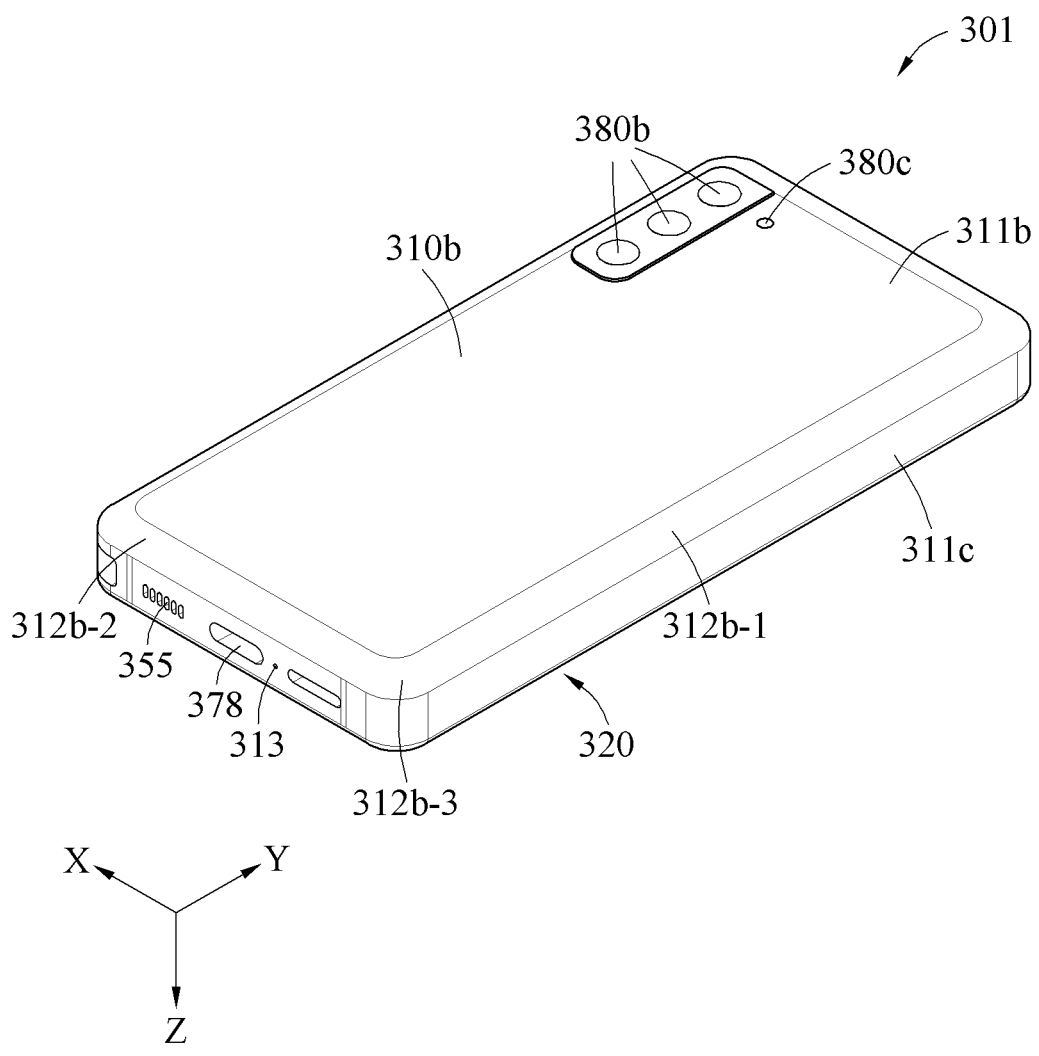
FIG. 3B is a rear perspective view of an electronic device according to an example embodiment.
Figure 4:
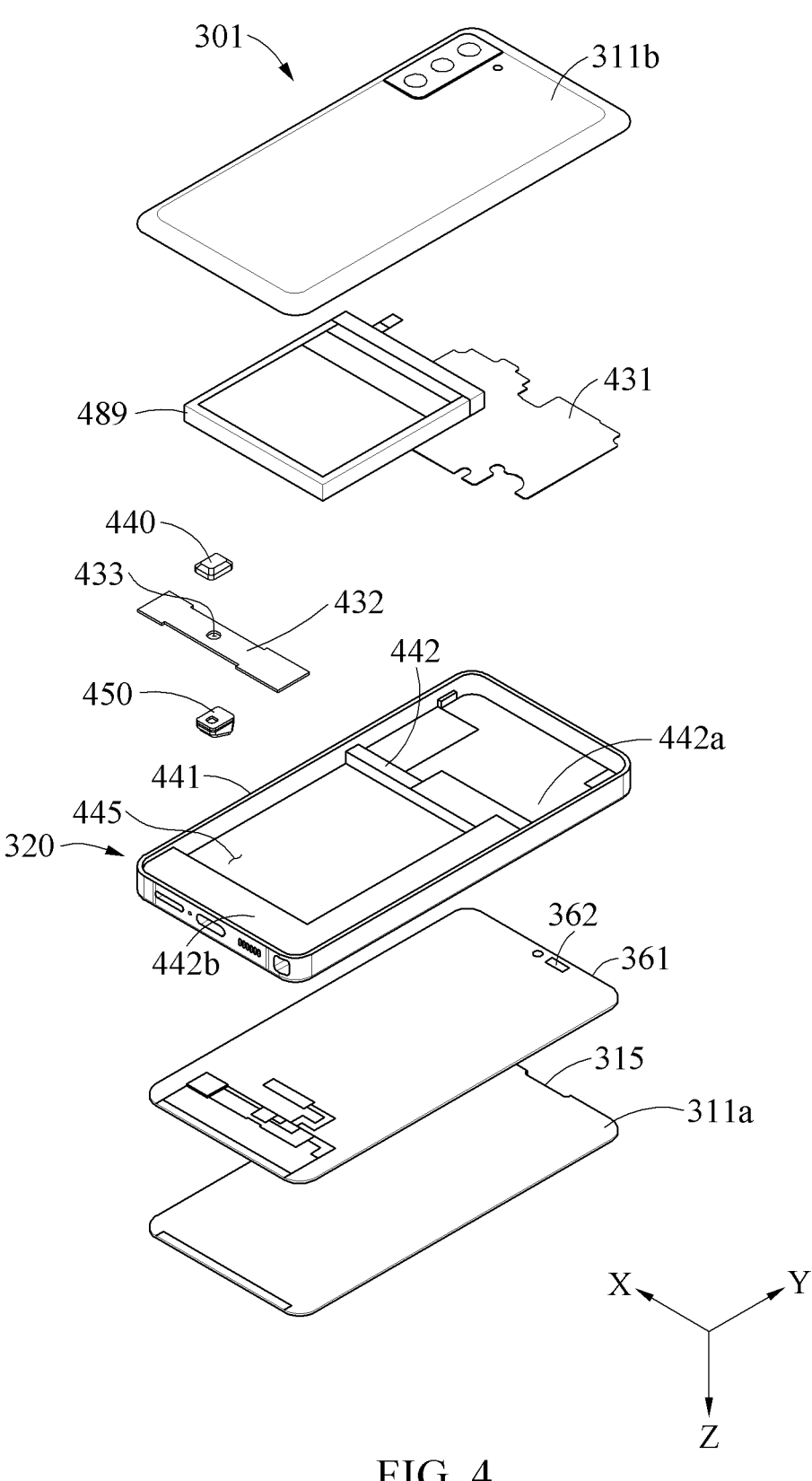
FIG. 4 is an exploded perspective view of an electronic device according to an example embodiment.

FIG. 3A is a front perspective view of an electronic device according to an embodiment, FIG. 3B is a rear perspective view of the electronic device according to an embodiment, and FIG. 4 is an exploded perspective view of the electronic device according to an embodiment.

Referring to FIGS. 3A, 3B, and 4, an electronic device 301 (e.g., the electronic device 101 of FIG. 1) according to an embodiment may include a housing 310 having a front surface 310a (e.g., a first surface), a rear surface 310b (e.g., a second surface), and a side surface 311c (e.g., a third surface) surrounding an internal space between the front surface 310a and the rear surface 310b.

In an embodiment, the front surface 310a may be formed by a first plate 311a of which at least a portion is substantially transparent. For example, the first plate 311a may include a polymer plate or a glass plate including at least one coating layer. In an embodiment, the rear surface 310b may be formed by a second plate 311b that is substantially opaque. For example, the second plate 311b may be formed of coated or tinted glass, ceramic, polymer, metal (e.g., aluminum, stainless steel, or magnesium), or a combination thereof. The side surface 311c may be formed by a frame 320 that is coupled, directly or indirectly, to the first plate

311a and the second plate 311b and may include a metal and/or a polymer. In an embodiment, the second plate 311b and the frame 320 may be integrally and seamlessly formed. In an embodiment, the second plate 311b and the frame 320 may be formed of substantially the same material (e.g., aluminum).

In an embodiment, the first plate 311a may include a plurality of first periphery areas 312a-1 that are rounded in a direction from at least one area of the front surface 310a toward the second plate 311b and extend in one direction (e.g., a +/−Y-axial direction), a plurality of second periphery areas 312a-2 that are rounded in the direction from at least one area of the front surface 310a toward the second plate 311b and extend in the other direction (e.g., a +/−X-axial direction), and a plurality of third periphery areas 312a-3 that are rounded in the direction from at least one area of the front surface 310a toward the second plate 311b and positioned between the plurality of first periphery areas 312a-1 and the plurality of second periphery areas 312a-2.

In an embodiment, the second plate 311b may include a plurality of fourth periphery areas 312b-1 that are rounded in a direction from at least one area of the rear surface 310b toward the first plate 311a and extend in one direction (e.g., the +/−Y-axial direction), a plurality of fifth periphery areas 312b-2 that are rounded in the direction from at least one area of the rear surface 310b toward the first plate 311a and extend in the other direction (e.g., the +/−X-axial direction), and a plurality of sixth periphery areas 312b-3 that are rounded in the direction from at least one area of the rear surface 310b toward the first plate 311a and positioned between the plurality of fourth periphery areas 312b-1 and the plurality of fifth periphery areas 312b-2.

In an embodiment, the frame 320 may surround at least a portion of the internal space between the front surface 310a and the rear surface 310b. The frame 320 may include a first support area 441 disposed on at least a portion of the side surface 311c and a second support area 442 connected to the first support area 441 to form a space for disposing the components of the electronic device 301.

In an embodiment, the first support area 441 may connect the periphery of the first plate 311a and the periphery of the second plate 311b and surround the space between the first plate 311a and the second plate 311b, thereby forming the side surface 311c of the housing 310.

In an embodiment, the second support area 442 may be disposed inside (or in a body portion) of the electronic device 301. The second support area 442 may be integrally formed with the first support area 441 or may be formed separately from the first support area 441 and connected to the first support area 441. In an embodiment, PCBs 431 and 432 may be disposed on the second support area 442. The second support area 442 may be connected to, for example, grounds of the PCBS 431 and 432.

In an embodiment, a display 361 may be positioned on one surface (e.g., a lower surface (a surface in the +Z-axial direction) of FIG. 4) of the second support area 442, and the second plate 311b may be disposed on the other surface (e.g., an upper surface (a surface in the −Z-axial direction) of FIG. 4) of the second support area 442.

In an embodiment, at least a portion of the frame 320 may be formed of a conductive material. For example, the first support area 441 may be formed of a metal and/or a conductive polymer material. In an embodiment, like the first support area 441, the second support area 442 may be formed of a metal and/or a conductive polymer material.

In an embodiment, an acoustic duct (e.g., an acoustic duct 521 of FIG. 5C) may be formed on the frame 320 to transfer sounds between the inside and the outside of the housing 310. In an embodiment, the acoustic duct formed on the frame 320 may communicate with external sound holes 313, 315, and 355 of the electronic device 301. In an embodiment, external sounds of the electronic device 301 may be transferred to the internal space, for example, a microphone (e.g., a microphone disposed on a sound module 540 of FIG. 5C) of a sound module 440 (e.g., the sound module 540 of FIG. 5) via the sound hole 313 and the acoustic duct.

In an embodiment, the electronic device 301 may include the display 361 (e.g., the display module 160 of FIG. 1). In an embodiment, the display 361 may be positioned on the front surface 310a. In an embodiment, the display 361 may be exposed through at least a portion (e.g., the plurality of first periphery areas 312a-1, the plurality of second periphery areas 312a-2, and the plurality of third periphery areas 312a-3) of the first plate 311a.

In an embodiment, the periphery of the display 361 may substantially coincide with an outer edge of the first plate 311a. In an embodiment, the display 361 may include a touch sensing circuit, a pressure sensor for sensing an intensity (pressure) of a touch, and/or a digitizer for detecting a magnetic-type stylus pen.

In an embodiment, the display 361 may include a screen display area 361a that is visually exposed to display content through a pixel or a plurality of cells. In an embodiment, the screen display area 361a may include a sensing area 361a-1 and/or a camera area 361a-2. In this case, the sensing area 361a-1 may overlap at least one area of the screen display area 361a. The sensing area 361a-1 may allow transmission of an input signal related to a sensor module 376 (e.g., the sensor module 176 of FIG. 1). The sensing area 361a-1 may display content, like the screen display area 361a that does not overlap the sensing area 361a-1. For example, the sensing area 361a-1 may display the content while the sensor module 376 is not operating. The camera area 361a-2 may overlap at least one area of the screen display area 361a.

In an embodiment, the electronic device 301 may include the sound module 440 (e.g., the audio module 170 of FIG. 1). The sound module 440 may obtain sounds from the outside of the electronic device 301. For example, the sound module 440 may be positioned in the internal space of the housing 310. In an embodiment, the sound module 440 may obtain a sound via at least one sound hole 313.

In an embodiment, the electronic device 301 may include the sensor module 376. The sensor module 376 may sense a signal applied to the electronic device 301. The sensor module 376 may be positioned, for example, on the front surface 310a of the electronic device 301. The sensor module 376 may form the sensing area 361a-1 in at least a portion of the screen display area 361a. The sensor module 376 may receive an input signal transmitted through the sensing area 361a-1 and generate an electrical signal based on the received input signal. For example, the input signal may have a designated physical quantity (e.g., heat, light, temperature, sound, pressure, or ultrasound). In another example, the input signal may include a signal related to biometric information of a user (e.g., a fingerprint, a voice, and the like of a user).

In an embodiment, the electronic device 301 may include the camera modules 380a and 380b (e.g., the camera module 180 of FIG. 1). In an embodiment, the camera modules 380a and 380b may include a first camera module 380a, a second camera module 380b, and a flash 380c. In an embodiment, the first camera module 380a may be disposed to be exposed through the front surface 310a of the housing 310, and the second camera module 380b and the flash 380c may be disposed to be exposed through the rear surface 310b of the housing 310. In an embodiment, at least a portion of the first camera module 380a may be disposed in the housing 310 so as to be covered through the display 361. In an embodiment, the first camera module 380a may receive an optical signal transmitted through the camera area 361a-2. In an embodiment, the second camera module 380b may include a plurality of cameras (e.g., dual cameras, triple cameras, or quad cameras). In an embodiment, the flash 380c may include a light-emitting diode or a xenon lamp.

In an embodiment, the electronic device 301 may include the external sound holes 315 and 355. The external sound holes 315 and 355 may output a sound to the outside of the electronic device 301, and the electronic device 301 may include the plurality of external sound holes 315 and 355. In an embodiment, the electronic device 301 may include the sound hole 313 through which a sound from the outside of the electronic device 301 may be input to the inside of the electronic device 301.

For example, the first external sound hole 315 may be formed adjacent to the side surface 311c in one direction (e.g., the +Y direction) of the housing 310 and, specifically, to the first camera module 380a or the camera area 361a-2 of the display 361. The second external sound hole 355 may be at least one hole formed on the side surface 311c in one direction (e.g., the −Y direction) of the housing 310. The electronic device 301 may output a stereophonic sound to the outside of the electronic device 301 through the first external sound hole 315 and the second external sound hole 355.

In an embodiment, an engraved area of the first external sound hole 315 may be provided on the outer edge of the first plate 311a, wherein the first plate 311a and the display 361 may be coupled, directly or indirectly, and the engraved area may be implemented as the first external sound hole 315.

According to an embodiment, the electronic device 301 may not include the first external sound hole 315 and may directly output the sound to the outside via a sound hole 362. The display 361 may include a notch structure in which the sound hole 362 and the first camera module 380a are positioned.

In an embodiment, the electronic device 301 may include an input module 350 (e.g., the input module 150 of FIG. 1). The input module 350 may receive a manipulation signal of a user. The input module 350 may include, for example, at least one key input device disposed to be exposed on the side surface 311c of the housing 310.

In an embodiment, the electronic device 301 may include a connecting terminal 378 (e.g., the connecting terminal 178 of FIG. 1). In an embodiment, the connecting terminal 378 may be disposed on the side surface 311c. For example, when the electronic device 301 is viewed in one direction (e.g., the +Y-axial direction of FIG. 3A), the connecting terminal 378 may be positioned at a central portion of the side surface 311c, and the external sound hole 355 may be disposed in one direction (e.g., a right direction) with respect to the connecting terminal 378.

In an embodiment, the electronic device 301 may include the PCBs 431 and 432 and a battery 489 (e.g., the battery 189 of FIG. 1). In an embodiment, the PCBs 431 and 432 may include the first PCB 431 and the second PCB 432. In this case, the first PCB 431 may be accommodated in a first board slot 442a of the second support area 442, and the second PCB 432 may be accommodated in a second board slot 442b of the second support area 442. In an embodiment, the battery 489 may be accommodated in a battery slot 445 of the second support area 442 formed between the first board slot 442*a* and the second board slot 442*b*.

In an embodiment, electrical circuits for transmitting electrical signals may be formed on the PCBs 431 and 432. In an embodiment, one or more electrical components for achieving the functions of the electronic device 301 may be disposed (e.g., mounted) on surfaces of the PCBs 431 and 432. For example, the electrical components may include components, such as an AP, a GPU, and a PMIC, for performing functions in the electronic device 301. In an embodiment, an opening 433 that is open to at least a portion to penetrate a surface of the second PCB 432 may be formed on the second PCB 432. In an embodiment, the sound module 440 for performing sound functions may be disposed on the PCBs 431 and 432.

According to an embodiment, a processor (e.g., the processor 120 of FIG. 1) may be disposed on the PCBs 431 and 432. The processor may include, for example, one or more of a CPU, an AP, a GPU, an image signal processor, a sensor hub processor, or a communication processor. According to an embodiment, a wireless communication circuit (e.g., the wireless communication module 192 of FIG. 1) may be disposed on the PCBs 431 and 432. The wireless communication circuit may perform communication with, for example, an external device (e.g., the electronic device 104 of FIG. 1). The electronic device 301 may include an antenna structure (e.g., the antenna module 197 of FIG. 1), and the wireless communication circuit may be electrically connected to the antenna structure. In an embodiment, the wireless communication circuit may generate a signal to be transmitted through the antenna structure or detect a signal received through the antenna structure. In an embodiment, the PCBs 431 and 432 may include grounds, and the grounds of the PCBs 431 and 432 may function as a ground of the antenna structure implemented using the wireless communication circuit.

In an embodiment, the electronic device 301 may include the sound module 440 including one or more microphones. In an embodiment, the sound module 440 may generate an electrical signal according to a sound transmitted from the outside of the electronic device 301. In another embodiment, the sound module 440 may include a speaker, and generate a sound according to an electrical signal. In an embodiment, the sound module 440 including the microphone and the sound module 440 including the speaker may be individually provided in the electronic device 301. In an embodiment, one sound module 440 may include a microphone and a speaker at the same time. Hereinafter, the description will be made assuming that the sound module 440 includes a microphone, however, embodiments are not limited thereto. In an embodiment, the sound module 440 may be electrically connected to the second PCB 432 directly or indirectly to generate an electrical signal according to a sound received via the microphone. The opening 433 that is open to penetrate at least a portion of the surface may be formed on the second PCB 432 to move a sound between the microphone and the acoustic duct (e.g., the acoustic duct 521 of FIG. 5C) of the sound module 440. In an embodiment, the sound module 440 may be disposed on the second PCB 432 such that the microphone is positioned in the opening 433 of the second PCB 432. In an embodiment, sound waves that flow into the acoustic duct from the outside of the electronic device 301 via the sound hole 313 may be input to the microphone of the sound module 440 through the opening 433 of the second PCB 432.

In an embodiment, the electronic device 301 may include a sealing member 450 comprising seal material. In an embodiment, the sealing member 450 may seal a gap between the frame 320 and the second PCB 432 to prevent or reduce sound leakage. In an embodiment, the sealing member 450 may be disposed on the second PCB 432 to be opposite to the sound module 440. In an embodiment, the sealing member 450 may be disposed on, directly or indirectly, the second PCB 432 to overlap the sound module 440 and the opening 433 of the second PCB 432 with respect to a height direction (e.g., a Z-axial direction of FIG. 4) of the electronic device 301.

Figure 5A:
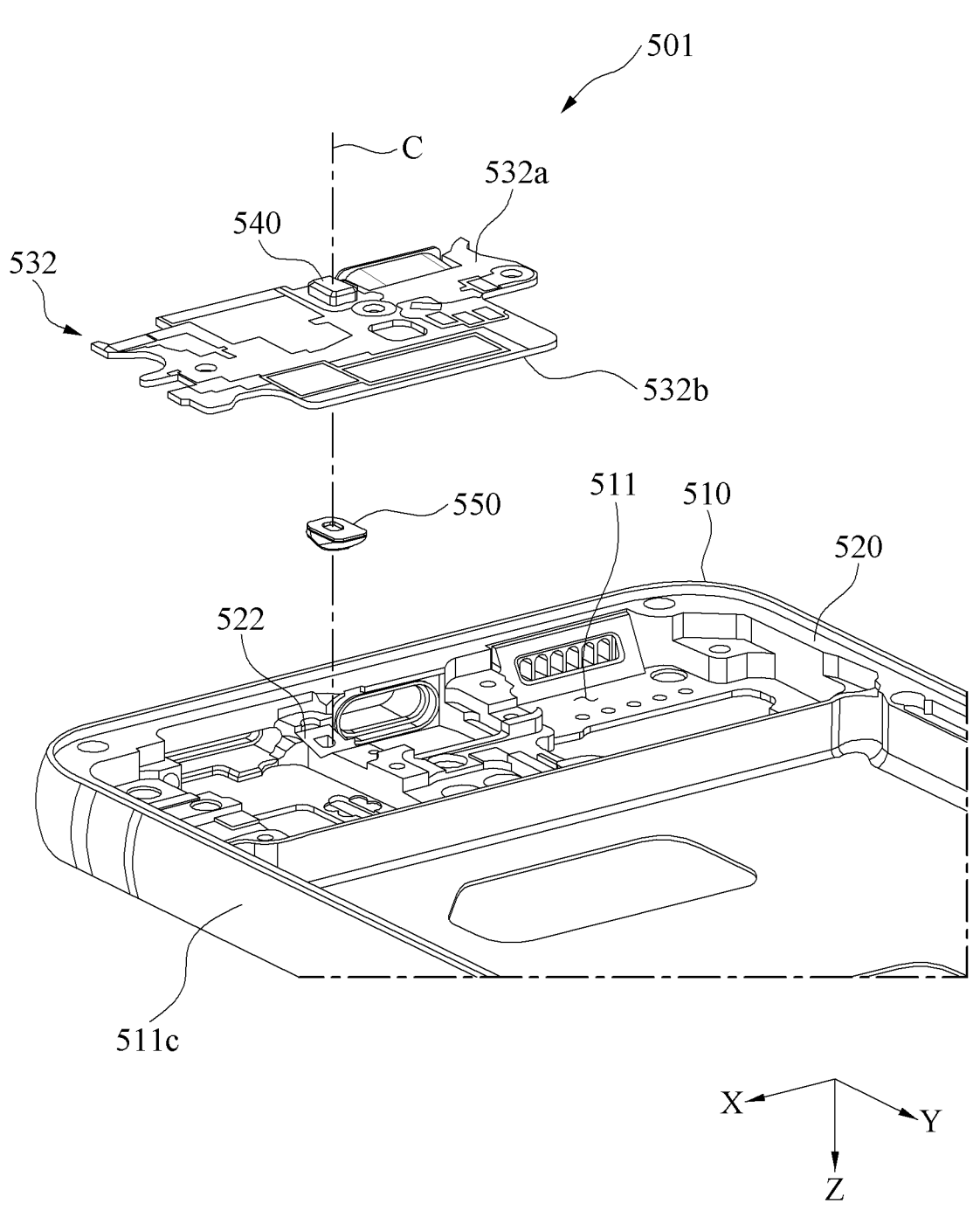
FIG. 5A is a partially exploded perspective view of an electronic device illustrating a support area of a front frame, a sealing member, a printed circuit board (PCB), and a sound module according to an example embodiment.
Figure 5B:
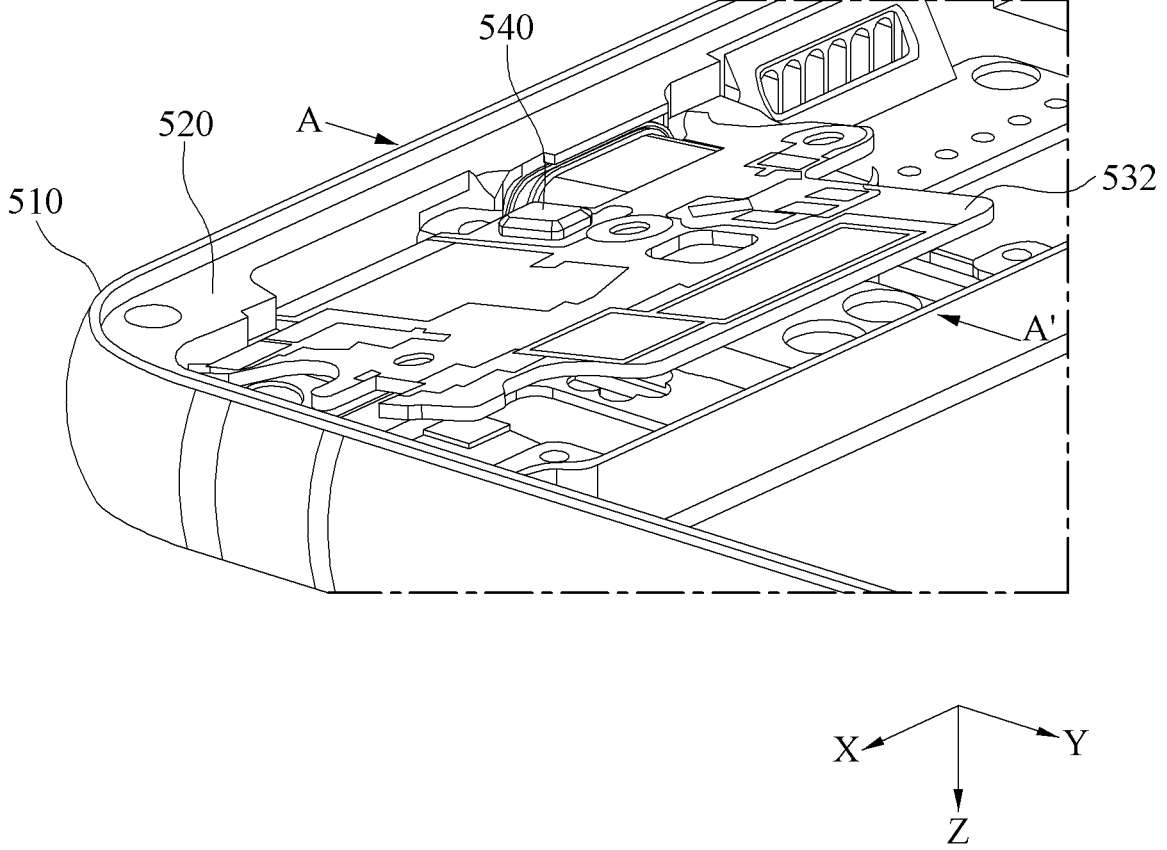
FIG. 5B is a partial perspective view illustrating a state before a PCB is assembled on a front frame according to an example embodiment.
Figure 5C:
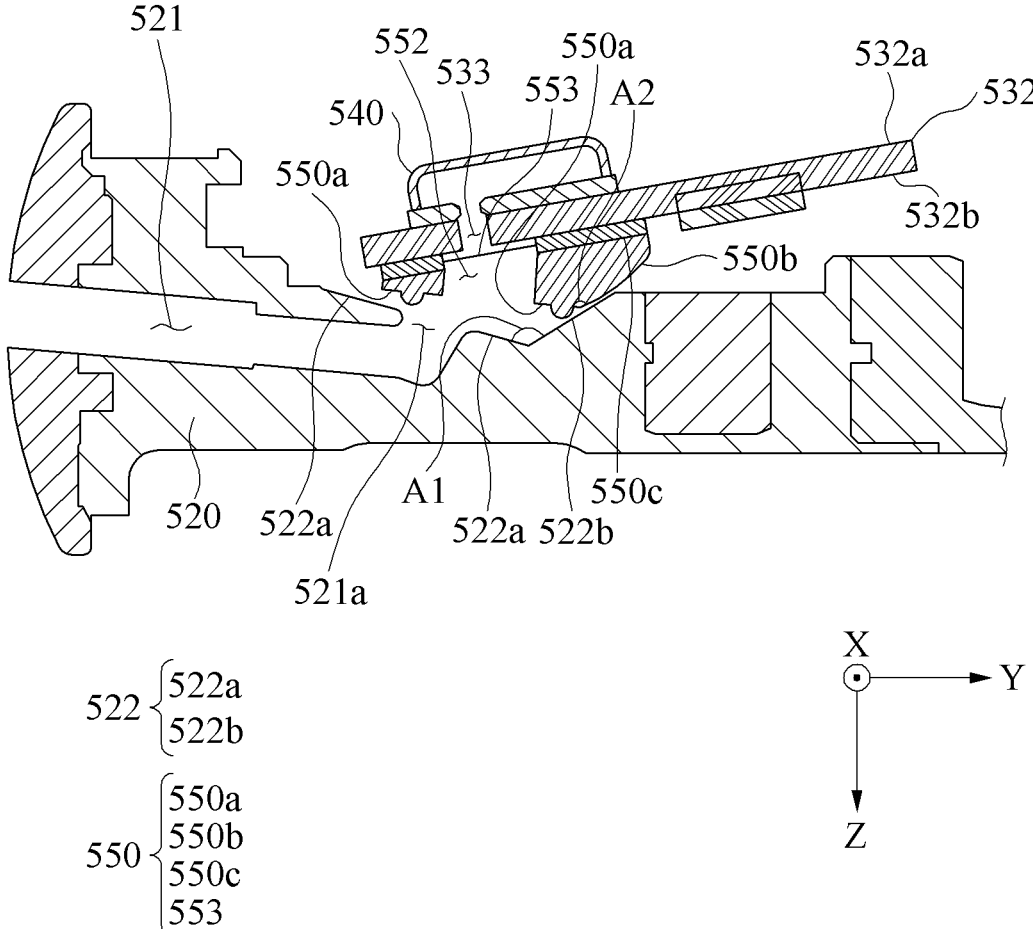
FIG. 5C is a cross-sectional view taken along line A-A' of FIG. 5B.
Figure 5D:
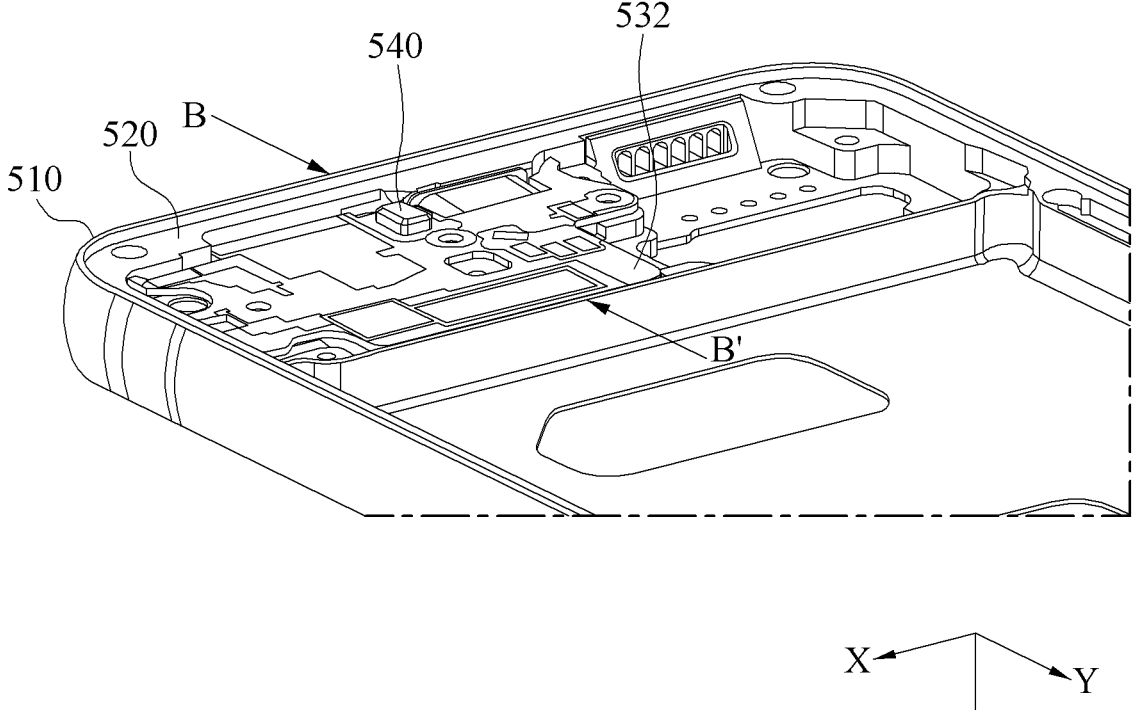
FIG. 5D is a partial perspective view illustrating a state in which another PCB is assembled on a front frame according to an example embodiment.
Figure 5E:
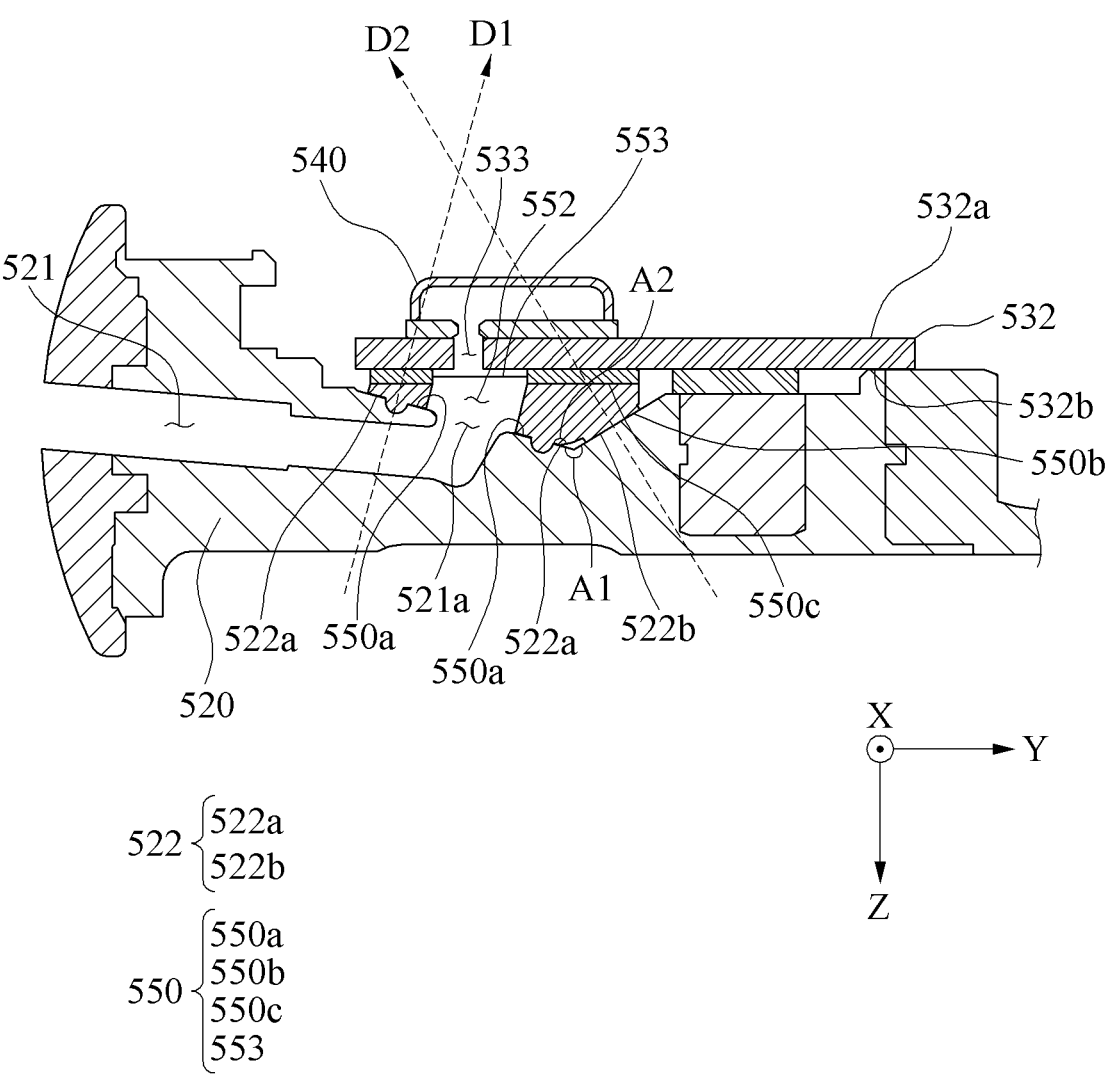
FIG. 5E is a cross-sectional view taken along line B-B' of FIG. 5D.
Figure 5F:
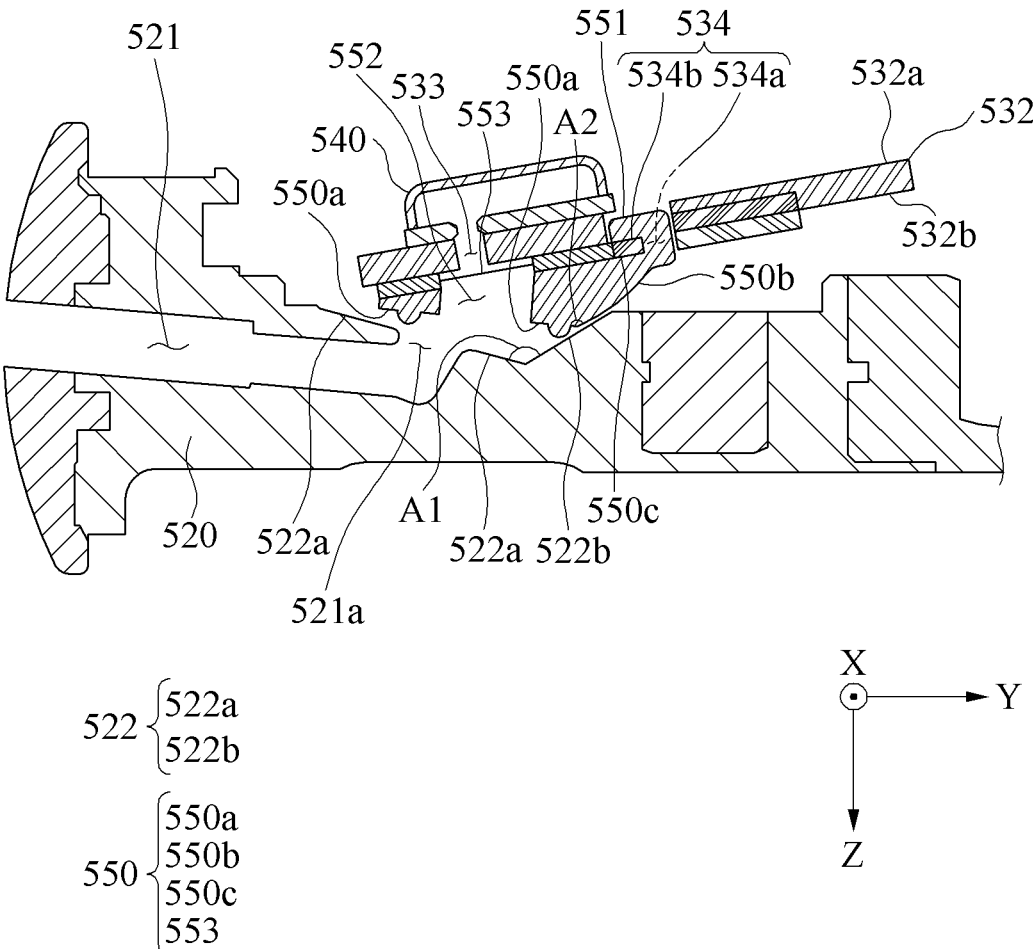
FIG. 5F is a cross-sectional view illustrating a front frame, a PCB, a sound module, and a sealing member according to an example embodiment.

FIG. 5A is a partially exploded perspective view of an electronic device illustrating a support area of a front frame, a sealing member comprising seal material, a PCB, and a sound module according to an embodiment, FIG. 5B is a partial perspective view illustrating a state before the PCB is assembled on the front frame according to an embodiment, FIG. 5C is a cross-sectional view taken along line A-A' of FIG. 5B, FIG. 5D is a partial perspective view illustrating a state in which another PCB is assembled on the front frame according to an embodiment, FIG. 5E is a cross-sectional view taken along line B-B' of FIG. 5D, and FIG. 5F is a cross-sectional view illustrating the front frame, the PCB, the sound module, and the sealing member according to an embodiment.

Referring to FIGS. 5A to 5F, an electronic device 501 (e.g., the electronic device 301 of FIG. 3A) according to an embodiment may include a housing 510 (e.g., the housing 310 of FIG. 3A) including a front frame 520 (e.g., the frame 320 of FIG. 4) on which an acoustic duct 521 is formed, a PCB 532 (e.g., the second PCB 432 of FIG. 4) disposed in an internal space 511 of the housing 510, a sound module 540 (e.g., the sound module 440 of FIG. 4) electrically connected to the PCB 532, and a sealing member 550 (e.g., the sealing member 450 of FIG. 4) disposed between the front frame 520 and the PCB 532.

The housing 510 may form an exterior of the electronic device 501. In an embodiment, the housing 510 may form the internal space 511. In an embodiment, a sound hole (e.g., the sound hole 313 of FIG. 3A) may be formed on an outer surface of the housing 510. For example, the sound hole may be formed on a side surface 511*c* of the housing 510. In an embodiment, a display (e.g., the display 361 of FIG. 3A) may be disposed on a front surface (e.g., the front surface 310*a* of FIG. 3A) of the housing 510. In an embodiment, the front frame 520, on which the acoustic duct 521 is formed, may be disposed in the internal space 511 of the housing 510.

In an embodiment, the front frame 520 may be disposed in the internal space 511 of the housing 510. For example, the front frame 520 may surround at least a portion of the internal space 511 between the front surface (e.g., the front surround 310*a* of FIG. 3A) and a rear surface (e.g., the rear surface 310*b* of FIG. 3B) of the housing 510. For example, at least a portion of the front frame 520 may be provided to be adjacent to the side surface 511*c* of the housing 510, on which the sound hole is formed. In an embodiment, the front frame 520 may be formed separately from the housing 510, but may also be formed integrally with the housing 510. For example, the front frame 520 may form at least a portion of the side surface 511*c* of the housing 510.

In an embodiment, the acoustic duct 521 for movement of a sound may be formed on the front frame 520. In an embodiment, the acoustic duct 521 may be formed to penetrate the inside of the front frame 520, and may function as a path through which a sound may move. In an embodiment, one end of the acoustic duct 521 may communicate with the sound hole formed on the housing 510 with respect to the path formed by the acoustic duct 521. In an embodiment, the acoustic duct 521 may include an open area 521a formed in the front frame 520 to be open in the internal space 511 of the housing 510. In an embodiment, the open area 521a may be formed to be open toward the sound module 540 to be described below.

In an embodiment, the front frame 520 may include the open area 521a. For example, the open area 521a may be formed in a support area 522 of the front frame 520. In an embodiment, the open area 521a may be formed to be open in a direction (e.g., the −Z-axial direction) toward a second board surface 532b of the PCB 532. For example, the support area 522 may communicate with the acoustic duct 521 via the open area 521a.

In an embodiment, the front frame 520 may include the support area 522. In an embodiment, the sealing member 550 may be disposed in the support area 522. In an embodiment, the support area 522 of the front frame 520 may support at least a portion of the sealing member 550 to fix a position of the sealing member 550 in the electronic device 501. In an embodiment, the support area 522 may be formed in a recess shape on a surface (e.g., a surface facing the −Z-axial direction) of the front frame 520. For example, the support area 522 may be formed to be inclined with respect to the height direction (e.g., the +Z-axial direction) of the housing 510 from the front surface toward the rear surface of the housing 510.

In an embodiment, the support area 522 may include a first support surface 522a formed to be inclined with respect to the height direction (e.g., the Z-axial direction) of the housing 510, and a second support surface 522b formed to extend with a first inclination angle A1 formed with the first support surface 522a. In an embodiment, the first support surface 522a and the second support surface 522b may support the sealing member 550 comprising seal material.

In an embodiment, the first support surface 522a may be formed to be inclined with respect to the height direction (e.g., the Z-axial direction) of the housing 510 from the front surface toward the rear surface of the housing 510. In an embodiment, the first support surface 522a may support the sound module 540, the PCB 532, and the sealing member 550 disposed on the first support surface 522a in a first support direction D1 orthogonal to the first support surface 522a.

In an embodiment, the second support surface 522b may be formed to extend from the first support surface 522a, and may be formed to be inclined with respect to the height direction (e.g., the Z-axial direction) of the housing 510. In an embodiment, the second support surface 522b may be formed to form the first inclination angle A1 with the first support surface 522a. In an embodiment, the second support surface 522b may support the sound module 540, the PCB 532, and the sealing member 550 disposed on the second support surface 522b in a second support direction D2 orthogonal to the second support surface 522b.

In an embodiment, a load of the PCB 532 and the sound module 540 may be distributed to and exerted on each of the first support surface 522a and the second support surface 522b of the front frame 520 through an inclination formed by a first sealing surface 550a and a second sealing surface 550b and an inclination formed by the first support surface 522a and the second support surface 522b of the front frame 520. For example, the first support direction D1 of the first support surface 522a and the second support direction D2 of the second support surface 522b may not be parallel. In an embodiment, since the first support surface 522a and the second support surface 522b are formed such that the respective support directions are not parallel, the sound module 540, the PCB 532, and the sealing member 550 may be supported with the even load, thereby improving stability of the structure.

In an embodiment, the PCB 532 may be disposed in the internal space 511 of the housing 510. In an embodiment, the PCB 532 may be disposed to be opposite to a display (e.g., the display 361 of FIG. 3A) with the front frame 520 interposed therebetween. In an embodiment, the PCB 532 may be assembled on the front frame 520 in a direction inclined with respect to the height direction (e.g., the Z-axial direction) of the front frame 520 (e.g., an inclined direction of the PCB 532 of FIG. 5B) in order to prevent or reduce foreign substances introducing to the sound module 540. In an embodiment, during a process in which the PCB 532 is assembled on the front frame 520 in the inclined direction, the PCB 532 may be mounted on the front frame 520 to be parallel with a longitudinal direction (e.g., the Y-axial direction) of the front frame 520 by respective inclined structures of the sealing member 550 and the front frame 520 to be described below (e.g., an inclined structure formed by the first support surface 522a and the second support surface 522b of the front frame 520, and an inclined structure formed by the first sealing surface 550a and the second sealing surface 550b of the sealing member 550).

In an embodiment, the PCB 532 may include a first board surface 532a and a second board surface 532b that is opposite to the first board surface 532a. In an embodiment, the PCB 532 may be fixed to the front frame 520 such that the second board surface 532b contacts at least a portion of the surface of the front frame 520. In an embodiment, the PCB 532 may include an opening 533 formed to open at least a portion to penetrate the surface of the PCB 532. In an embodiment, the opening 533 of the PCB 532 may overlap at least a portion of the acoustic duct 521, for example, the open area 521a of the acoustic duct 521, with respect to a central axis C (e.g., the Z-axial direction) orthogonal to the second board surface 532b. In an embodiment, a sound input to the acoustic duct 521 may pass through the opening 533 through the open area 521a.

In an embodiment, the sound module 540 may accommodate a sound introduced into the internal space 511 of the electronic device 501 from the outside of the electronic device 501. In an embodiment, the sound module 540 may include at least one microphone for accommodating a sound. In an embodiment, the sound module 540 may be disposed on the PCB 532. For example, the sound module 540 may be mounted on the surface of the PCB 532 and electrically connected to an electrical circuit formed on the PCB 532. In an embodiment, the sound module 540 may be disposed on the first board surface 532a of the PCB 532. For example, the sound module 540 may be disposed on the first board surface 532a to overlap the opening 533 of the PCB 532 with respect to the central axis C orthogonal to the first board surface 532a of the PCB 532.

In an embodiment, in a state where the PCB 532 is connected to the front frame 520, the sound module 540 may face the front frame 520. In an embodiment, the microphone of the sound module 540, the opening 533 of the PCB 532, and the open area 521a of the acoustic duct 521 may overlap each other with respect to the central axis C orthogonal to the first board surface 532a of the PCB 532. In an embodiment, a sound input from the outside of the electronic device 501 to the acoustic duct 521 may be transferred to the microphone of the sound module 540 via the opening 533 of the PCB 532. For example, a sound transfer path from the outside of the electronic device 501 to the microphone of the sound module 540 may be formed through the sound hole, the acoustic duct 521, and the opening 533 of the PCB 532. The microphone of the sound module 540 may receive a sound transferred from the outside via the acoustic duct 521.

In an embodiment, the sealing member 550 may be disposed between the PCB 532 and the front frame 520 and transfer the sound transferred from the acoustic duct 521 to the microphone. In an embodiment, the sealing member 550 may include a vibrating membrane 553 to transfer a vibration generated by a sound. In an embodiment, a through hole 552 communicating with the opening 533 of the front frame 520 may be formed on the sealing member 550. In an embodiment, the vibrating membrane 553 of the sealing member 550 may vibrate by waves of sound (e.g., sound waves) input through the acoustic duct 521, and the sound waves generated by the vibration may be transferred to the sound module 540. The vibrating membrane 553 may cover the opening 533 of the PCB 532. In an embodiment, the vibrating membrane 553 may be an acoustic membrane. In an embodiment, the vibrating membrane 553 may prevent or reduce malfunction of the microphone of the sound module 540 due to dust and water damage. In an embodiment, the vibrating membrane 553 may include a material that allows a gas such as air or a sound to pass through, but does not allow a liquid or dust to pass through. For example, the vibrating membrane 553 may include at least one of polytetrafluoroethylene (PTFE), expanded PTFE (ePTFE), and polyvinylidene fluoride (PVDF). However, this is merely an example, and the material of the vibrating membrane 553 may include various materials according to an embodiment.

In an embodiment, the sealing member 550 may overlap the open area 521a of the acoustic duct 521 and the opening 533 of the PCB 532 with respect to the central axis C orthogonal to the first board surface 532a of the PCB 532. In an embodiment, the sealing member 550 may seal a gap formed between the front frame 520 and the PCB 532 along the circumference of the open area 521a of the acoustic duct 521 and the opening 533 of the PCB 532 to prevent or reduce the occurrence of sound leakage during a process of transferring the sound. The sealing member 550 may prevent or reduce foreign substances, including a moisture, from being introduced to the open area 521a of the acoustic duct 521 and the opening 533 of the PCB 532.

In an embodiment, the sealing member 550 may be seated in the support area 522 of the front frame 520. In an embodiment, in a state where the sealing member 550 is seated in the support area 522 of the front frame 520, at least a portion of an edge of the sealing member 550 may be supported by the support area 522. In an embodiment, at least a portion of the sealing member 550 may include a compressible material. For example, the sealing member 550 may be formed of at least one of rubber and silicon. In an embodiment, the sealing member 550 may be compressed in a thickness direction (e.g., the Z-axial direction) of the sealing member 550, during a process in which the PCB 532 is fixed to the front frame 520, to seal the gap between the front frame 520 and the PCB 532. In an embodiment, the sealing member 550 may be formed to have a compression thickness that substantially corresponds to the gap between the PCB 532 adjacent to the opening 533 and the front frame 520 based on a state in which the PCB 532 is fixed to the front frame 520, to secure ease of assembly on the front frame 520 and the PCB 532.

In an embodiment, the sealing member 550 may have an inclined shape based on a state of facing the second board surface 532b of the PCB 532. In an embodiment, the sealing member 550 may include an attachment surface 550c attached to the PCB 532, and the first sealing surface 550a and the second sealing surface 550b disposed on the front frame 520. In an embodiment, the attachment surface 550c of the sealing member 550 may be attached to the second board surface 532b of the PCB 532. In an embodiment, an adhesive member (e.g., a double-sided tape) to be attached to the second board surface 532b may be disposed on the attachment surface 550c of the sealing member 550. In an embodiment, the attachment surface 550c of the sealing member 550 may be formed of a material with high adhesion or frictional force in order to prevent or reduce detachment of the sealing member 550 from the PCB 532. For example, the attachment surface 550c of the sealing member 550 may be formed of a waterproof mesh material.

In an embodiment, the first sealing surface 550a of the sealing member 550 may be disposed on, directly or indirectly, the first support surface 522a of the front frame 520. In an embodiment, the first sealing surface 550a and the second sealing surface 550b of the sealing member 550 may each be formed to be inclined with respect to the thickness direction (e.g., the Z-axial direction) of the sealing member 550. In an embodiment, the second sealing surface 550b of the sealing member 550 may be formed to extend from the first sealing surface 550a. In an embodiment, the second sealing surface 550b may be formed to form a second inclination angle A2 with the first sealing surface 550a. In an embodiment, the second sealing surface 550b of the sealing member 550 may be disposed on, directly or indirectly, the second support surface 522b of the front frame 520. In an embodiment, the first sealing surface 550a and the second sealing surface 550b may be formed to have inclination parallel to the first support surface 522a and the second support surface 522b of the front frame 520, respectively. For example, the second inclination angle A2 formed by the first sealing surface 550a and the second sealing surface 550b may be substantially the same as the first inclination angle A1 formed by the first support surface 522a and the second support surface 522b. In an embodiment, since the inclined structures formed on the sealing member 550 and the front frame 520 respectively have corresponding shapes, the front frame 520 may support and surround at least a portion of the sealing member 550. In an embodiment, when the PCB 532 is assembled on the front frame 520 in the inclined direction, the first sealing surface 550a of the sealing member 550 attached to the second board surface 532b of the PCB 532 may be connected to the first support surface 522a of the front frame 520, and the PCB 532 may be seated on, directly or indirectly, the front frame 520. In an embodiment, since the second sealing surface 550b of the sealing member 550 is disposed on, directly or indirectly, the second support surface 522b of the front frame 520, and the second sealing surface 550b is supported by the second support surface 522b, the slipping of the PCB 532 in a direction (e.g., the +Y-axial direction) opposite to a direction of entering the front frame 520 (e.g., a direction substantially parallel to the −Y-axial direction) may be prevented or reduced.

Referring to FIG. 5F, in an embodiment, a guide portion 534 and a protrusion 551 may be formed on the PCB 532 and the sealing member 550, respectively. In an embodiment, the protrusion 551 of the sealing member 550 may be formed to protrude from the first sealing surface 550a or the second sealing surface 550b toward the second board surface 532b of the PCB 532. In an embodiment, the protrusion 551 of the sealing member 550 may be fit to the PCB 532 to prevent or reduce the detachment of the sealing member 550 from the PCB 532, and fix the position of the sealing member 550 with respect to the PCB 532. In an embodiment, the guide portion 534 for accommodating the protrusion 551 of the sealing member 550 may be formed on the PCB 532. In an embodiment, the guide portion 534 of the PCB 532 may include an accommodation space 534a and a seating portion 534b. In an embodiment, the accommodation space 534a of the guide portion 534 may be formed to penetrate at least a portion of the PCB 532 in a direction (e.g., the −Z-axial direction of FIG. 5F) from the second board surface 532b toward the first board surface 532a of the PCB 532. In an embodiment, the seating portion 534b of the guide portion 534 may be positioned in the accommodation space 534a of the guide portion 534, and the protrusion 551 of the sealing member 550 may be seated on, directly or indirectly, the seating portion 534b. In an embodiment, the protrusion 551 of the sealing member 550 may pass through the second board surface 532b of the PCB 532 through the accommodation space 534a formed on the PCB 532, and may be seated on, directly or indirectly, the seating portion 534b of the guide portion 534.

Figure 6A:
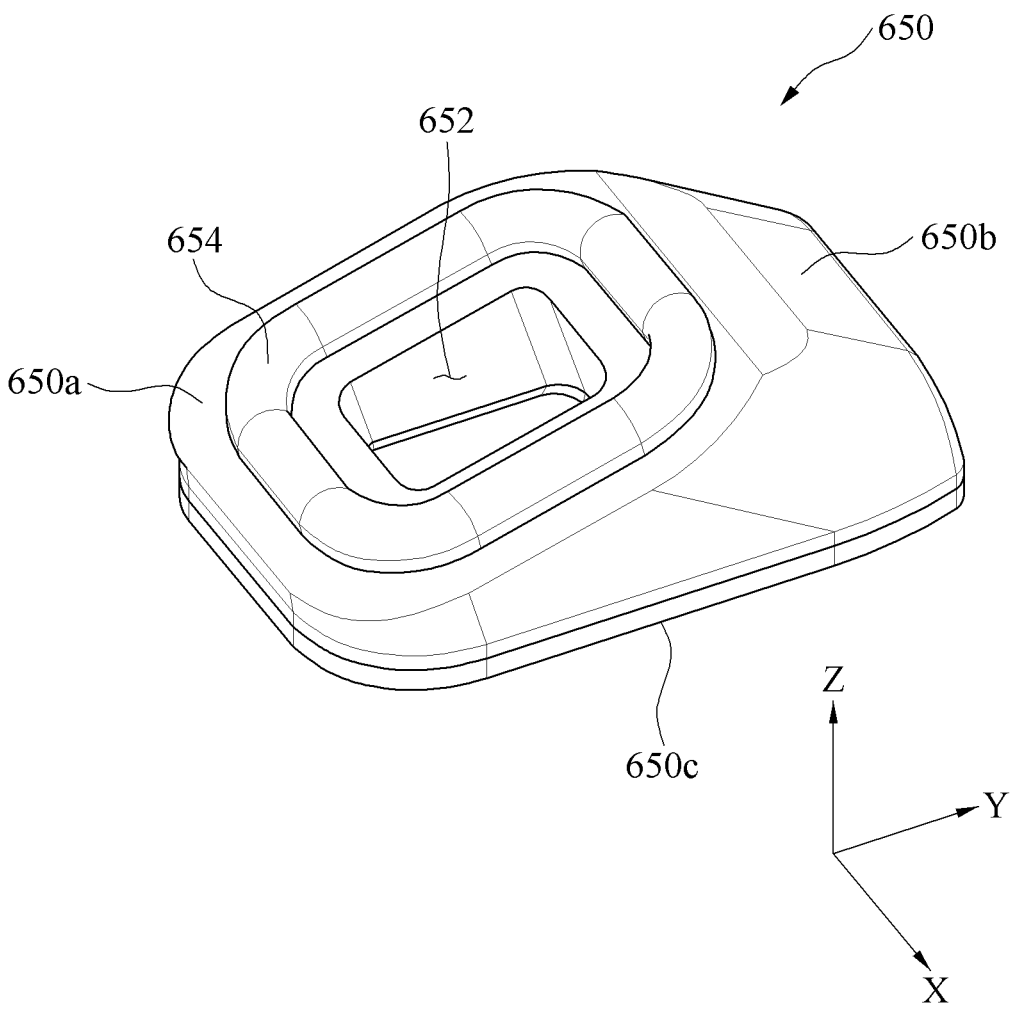
FIG. 6A is a perspective view illustrating a first sealing surface and a second sealing surface of a sealing member according to an example embodiment.
Figure 6B:
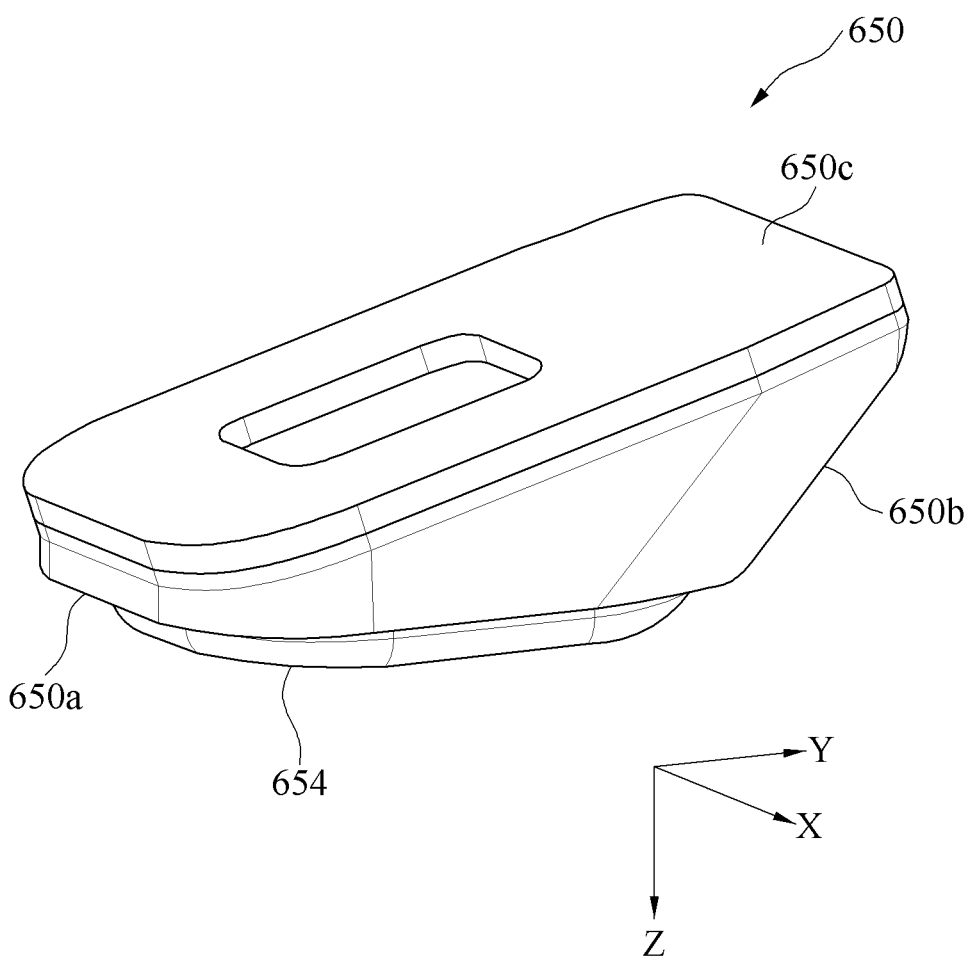
FIG. 6B is a perspective view illustrating an attachment surface of a sealing member according to an example embodiment.

FIG. 6A is a perspective view illustrating a first sealing surface and a second sealing surface of a sealing member according to an embodiment, and FIG. 6B is a perspective view illustrating an attachment surface of a sealing member according to an embodiment.

Referring to FIGS. 6A and 6B, in an embodiment, a sealing member 650 (e.g., the sealing member 550 of FIG. 5A) may include a first sealing surface 650a (e.g., the first sealing surface 550a of FIG. 5C) and a second sealing surface 650b (e.g., the second sealing surface 550b of FIG. 5C) formed to be inclined with respect to a thickness direction (e.g., the Z-axial direction) of the sealing member 650, and an attachment surface 650c (e.g., the attachment surface 550c of FIG. 5C) to be attached to a PCB (e.g., the PCB 532 of FIG. 5A).

Each embodiment herein may be used in combination with any other embodiment(s) described herein.

In an embodiment, a protruding portion 654 may be formed on the first sealing surface 650a of the sealing member 650. In an embodiment, the protruding portion 654 may be formed along a circumferential direction of at least a portion of the first sealing surface 650a, and may be formed to protrude in a direction (e.g., the +Z-axial direction) from the first sealing surface 650a toward a first support surface (e.g., the first support surface 522a of FIG. 5E) of a front frame (e.g., the front frame 520 of FIG. 5E). In an embodiment, the protruding portion 654 of the sealing member 650 may be formed of a different material from the first sealing surface 650a. For example, the protruding portion 654 may be formed by embossment (EMBO). In an embodiment, the protruding portion 654 may prevent or reduce damage to the sealing member 650 during the process in which the PCB is seated on the front frame. In an embodiment, the protruding portion 654 of the sealing member 650 may overlap the front frame to seal a gap between the sealing member and the front frame in a state where the PCB is seated on the front frame, thereby performing functions of waterproofing and/or dustproofing with respect to the outside.

In an embodiment, a through hole 652 may be formed in the sealing member 650. In an embodiment, the through hole 652 may be formed to penetrate at least a portion of the sealing member 650 along the thickness direction (e.g., the Z-axial direction) of the sealing member 650. For example, the through hole 652 of the sealing member 650 may be formed to penetrate from the first sealing surface 650a and the second sealing surface 650b of the sealing member 650 to a vibrating membrane (e.g., the vibrating membrane 553 of FIG. 5C) of the sealing member 650. In an embodiment, the through hole 652 may be provided as a sound path that allows a sound introduced from an acoustic duct to the sealing member 650 to move to a sound module through the vibrating membrane.

An electronic device 101;201;301;501 may include a housing 310;510 forming a front surface 310a, a rear surface 310b opposite to the front surface 310a, and a side surface 311c;511c surrounding an internal space 511 between the front surface 310a and the rear surface 310b, and including a front frame 320;520 which is disposed in the internal space 511 and forms at least a portion of the side surface 311c;511c, and on which a sound hole 313;315;355 for transferring a sound from an outside of the electronic device 101;201;301;501 to the internal space 511, and an acoustic duct 521 communicating with the sound hole 313;315;355 are formed, a PCB 432;532 which is supported by the front frame 320;520 and may include a first board surface 532a, a second board surface 532b opposite to the first board surface 532a, and an opening 533 formed to penetrate the first board surface 532a and the second board surface 532b to overlap the acoustic duct 521, a sound module 440;540 electrically connected to the PCB 432;532 and including a microphone disposed on, directly or indirectly, the first board surface 532a to overlap the opening 533, and a sealing member 450;550;650 that seals a portion between the front frame 320;520 and the PCB 432;532, and transfers a sound between the acoustic duct 521 and the opening 533. The front frame 320;520 may include a support area 522 supporting the sealing member 450;550;650 along a circumferential direction of the sealing member 450;550;650.

The support area 522 may include a first support surface 522a formed to be inclined in a height direction of the housing 310;510 from the front surface 310a toward the rear surface 310b of the housing 310;510, and a second support surface 522b formed to extend from the first support surface 522a to form a first inclination angle A1 with the first support surface 522a, and the sealing member 450;550;650 may be seated on the first support surface 522a and the second support surface 522b.

The support area 522 may support the sealing member 450;550;650 disposed on, directly or indirectly, the first support surface 522a in a first support direction D1 orthogonal to the first support surface 522a, and support the sealing member 450;550;650 disposed on, directly or indirectly, the second support surface 522b in a second support direction D2 orthogonal to the second support surface 522b.

The first support direction D1 and the second support direction D2 may not be parallel to each other.

The sealing member 450;550;650 may include an attachment surface 550c;650c attached to the second board surface 532b, a first sealing surface 550a;650a disposed on, directly or indirectly, the first support surface 522a, and a second sealing surface 550b;650b formed to extend from the first sealing surface 550a;650a to form a second inclination angle A2 with the first sealing surface 550a;650a, and disposed on, directly or indirectly, the second support surface 522b.

The first sealing surface 550a;650a may have an inclination parallel to the first support surface 522a, and the second sealing surface 550b;650b may have an inclination parallel to the second support surface 522b.

The first inclination angle A1 may be substantially the same as the second inclination angle A2.

The sealing member 450;550;650 may further include a protruding portion 654 that is formed along a circumferential direction of at least a portion of the first sealing surface 550a;650a, and formed to protrude from the first sealing surface 550a;650a toward the first support surface 522a.

The front frame 320;520 may have a longitudinal direction, and the PCB 432;532 may be substantially parallel to the longitudinal direction of the front frame 320;520 based on a state in which the sealing member 450;550;650 is seated on the front frame 320;520.

The front frame 320;520 may include an open area 521a that is open to a direction toward the second board surface 532b of the PCB 432;532, and the acoustic duct 521 may communicate with the opening 533 through the open area 521a.

The sealing member 450;550;650 may further include a through hole 552;652 that is formed to penetrate in a thickness direction of the sealing member 450;550;650, and overlaps the opening 533 when the first board surface 532a is viewed.

The PCB 432;532 may further include a guide portion 534 for preventing or reducing detachment of the sealing member 450;550;650, and the sealing member 450;550;650 may include a protrusion 551 to be fit to the guide portion 534.

The guide portion 534 may include an accommodation space 534a formed to penetrate at least a portion of the PCB 532 from the second board surface 532b toward the first board surface 532a, and a seating portion 534b on which the protrusion 551 is seated, and the protrusion 551 may pass through the second board surface 532b through the accommodation space 534a and may be seated on the seating portion 534b.

The sealing member 450;550;650 may include a vibrating membrane 553 that covers the opening 533, transfers a sound, and has waterproofing and dustproofing functions.

The sealing member 450;550;650 may include at least one of a rubber material or a silicon material.

An electronic device 101;201;301;501 may include a housing 310;510 forming a front surface 310a, a rear surface 310b opposite to the front surface 310a, and a side surface 311c;511c surrounding an internal space 511 between the front surface 310a and the rear surface 310b, and including a front frame 320;520 which is disposed in the internal space 511 and forms at least a portion of the side surface 311c; 511c, and on which a sound hole 313;315;355 for transferring a sound from an outside of the electronic device 101;201;301;501 to the internal space 511, and an acoustic duct 521 communicating with the sound hole 313;315;355 are formed, a PCB 432;532 which is supported by the front frame 320;520 and may include a first board surface 532a, a second board surface 532b opposite to the first board surface 532a, and an opening 533 formed to penetrate the first board surface 532a and the second board surface 532b to overlap the acoustic duct 521, a sound module 440;540 electrically connected to the PCB 432;532 and including a microphone disposed on, directly or indirectly, the first board surface 532a to overlap the opening 533, and a sealing member 450;550;650 that seals a portion between the front frame 320;520 and the PCB 432;532, transfers a sound between the acoustic duct 521 and the opening 533, and has an inclined shape based on a state in which the second board surface 532b is viewed, the front frame 320;520 may include a support area 522 supporting the sealing member 450;550; 650 along a circumferential direction of the sealing member 450;550;650, and the support area 522 may include a first support surface 522a formed to be inclined in a height direction of the housing 310;510 from the front surface 310a toward the rear surface 310b of the housing 310;510, and a second support surface 522b formed to extend from the first support surface 522a to form a first inclination angle A1 with the first support surface 522a.

Based on a state in which a load of the PCB 432;532 and the sound module 440;540 is exerted on the front frame 320;520, the load of the PCB 432;532 and the sound module 440;540 may be distributed to and exerted on each of the first support surface 522a and the second support surface 522b.

The sealing member 450;550;650 may include an attachment surface 550c;650c attached to the second board surface 532b, a first sealing surface 550a;650a disposed on, directly or indirectly, the first support surface 522a, and a second sealing surface 550b;650b formed to extend from the first sealing surface 550a;650a to form a second inclination angle A2 with the first sealing surface 550a;650a, and disposed on, directly or indirectly, the second support surface 522b.

An inclination formed by the first sealing surface 550a; 650a and the second sealing surface 550b;650b may have a shape corresponding to an inclination formed by the first support surface 522a and the second support surface 522b.

An electronic device 101;201;301;501 may include a housing forming a front surface 310a, a rear surface 310b to be opposite to the front surface 310a, and a side surface 311c;511c surrounding an internal space 511 between the front surface 310a and the rear surface 310b, and including a front frame 320;520 which is disposed in the internal space 511 and forms at least a portion of the side surface 311c; 511c, and on which a sound hole 313;315;355 for transferring a sound from an outside of the electronic device 101;201;301;501 to the internal space 511, and an acoustic duct 521 communicating with the sound hole 313;315;355 are formed, a PCB 432;532 which is supported by the front frame 320;520 and may include a first board surface 532a, a second board surface 532b opposite to the first board surface 532a, and an opening 533 formed to penetrate the first board surface 532a and the second board surface 532b to overlap the acoustic duct 521, a sound module 440;540 electrically connected to the PCB 432;532 and including a microphone disposed on, directly or indirectly, the first board surface 532a to overlap the opening 533, and a sealing member 450;550;650 that seals a portion between the front frame 320;520 and the PCB 432;532, transfers a sound between the acoustic duct 521 and the opening 533, and has an inclined shape based on a state in which the second board surface 532b is viewed. The front frame 320;520 may include a support area 522 supporting the sealing member 450;550;650 along a circumferential direction of the sealing member 450;550;650. The support area 522 may include a first support surface 522a formed to be inclined in a height direction of the housing 310;510 from the front surface 310a toward the rear surface 310b of the housing 310;510, and a second support surface 522b formed to extend from the first support surface 522a to form a first inclination angle A1 with the first support surface 522a. The sealing member 450;550; 650 may include an attachment surface 550c;650c attached to the second board surface 532b, a first sealing surface 550a;650a disposed on, directly or indirectly, the first support surface 522a with an inclination parallel to the first support surface 522a, and a second sealing surface 550b; 650b formed to extend from the first sealing surface 550a; 650a to form a second inclination angle A2, that is substantially the same as the first inclination angle A1, with the first sealing surface 550a;650a, and disposed on, directly or indirectly, the second support surface 522b with an inclination parallel to the second support surface 522b.

While the disclosure has been illustrated and described with reference to various embodiments, it will be understood that the various embodiments are intended to be illustrative, not limiting. It will further be understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
a housing comprising a front surface, a rear surface opposite to the front surface, and a side surface at least partially surrounding an internal space between the front surface and the rear surface, and comprising a front frame which is disposed in the internal space and forms at least a portion of the side surface, and on which a sound hole configured for transferring a sound from an outside of the electronic device to the internal space, and an acoustic duct configured for communicating with the sound hole, are formed;
a printed circuit board (PCB) supported by at least the front frame and comprising a first board surface, a second board surface opposite to the first board surface, and an opening formed to penetrate the first board surface and the second board surface to overlap the acoustic duct;
a sound module electrically connected to the PCB and comprising a microphone disposed on the first board surface to overlap the opening; and
a sealing member, comprising seal material, that seals a portion between at least the front frame and the PCB, and is configured to transfer a sound between the acoustic duct and the opening,
wherein the front frame comprises a support area supporting the sealing member along a circumferential direction of the sealing member.

2. The electronic device of claim 1, wherein the support area comprises:
a first support surface inclined in a height direction of the housing from the front surface toward the rear surface of the housing; and
a second support surface extending from the first support surface to form a first inclination angle with the first support surface, and
wherein the sealing member is seated on the first support surface and the second support surface.

3. The electronic device of claim 2, wherein the support area supports the sealing member disposed on the first support surface in a first support direction substantially orthogonal to the first support surface, and supports the sealing member disposed on the second support surface in a second support direction substantially orthogonal to the second support surface.

4. The electronic device of claim 3, wherein the first support direction and the second support direction are not parallel to each other.

5. The electronic device of claim 2, wherein the sealing member comprises:
an attachment surface attached to the second board surface;
a first sealing surface disposed on the first support surface; and
a second sealing surface extending from the first sealing surface to form a second inclination angle with the first sealing surface, and disposed on the second support surface.

6. The electronic device of claim 5, wherein
the first sealing surface has an inclination parallel to the first support surface, and
the second sealing surface has an inclination parallel to the second support surface.

7. The electronic device of claim 5, wherein the first inclination angle is substantially the same as the second inclination angle.

8. The electronic device of claim 5, wherein the sealing member further comprises a protruding portion that is formed along a circumferential direction of at least a portion of the first sealing surface, and formed to protrude from the first sealing surface toward the first support surface.

9. The electronic device of claim 1, wherein
the front frame has a longitudinal direction, and
the PCB is substantially parallel to the longitudinal direction of the front frame based on a state in which the sealing member is seated on the front frame.

10. The electronic device of claim 1, wherein
the front frame comprises an open area that is open to a direction toward the second board surface of the PCB, and
the acoustic duct communicates with the opening through the open area.

11. The electronic device of claim 1, wherein the sealing member further comprises a through hole that is formed to penetrate in a thickness direction of the sealing member, and overlaps the opening when the first board surface is viewed.

12. The electronic device of claim 1, wherein
the PCB further comprises a guide portion, and
the sealing member comprises a protrusion configured to be fit to the guide portion.

13. The electronic device of claim 12, wherein
the guide portion comprises an accommodation space configured to penetrate at least a portion of the PCB from the second board surface toward the first board surface, and a seating portion on which the protrusion is seated, and
the protrusion passes through the second board surface through the accommodation space and is seated on the seating portion.

14. The electronic device of claim 1, wherein the sealing member comprises a vibrating membrane that covers the opening, is configured to transfer a sound, and has waterproofing and dustproofing functions.

15. The electronic device of claim 1, wherein the sealing member comprises at least one of a rubber material or a silicon material.

16. An electronic device comprising:
a housing forming a front surface, a rear surface opposite to the front surface, and a side surface at least partially surrounding an internal space between the front surface and the rear surface, and comprising a front frame which is disposed in the internal space and forms at least a portion of the side surface, and on which a sound hole for transferring a sound from an outside of the electronic device to the internal space, and an acoustic duct communicating with the sound hole are formed;
a printed circuit board (PCB) supported by the front frame and comprising a first board surface, a second board surface opposite to the first board surface, and an opening penetrating the first board surface and the second board surface to overlap the acoustic duct;
a sound module electrically connected to the PCB and comprising a microphone disposed on the first board surface to overlap the opening; and a sealing member, comprising seal material, that seals a portion between at least the front frame and the PCB, and is configured to transfer a sound between the acoustic duct and the opening, and has an inclined shape based on a state in which the second board surface is viewed, wherein the front frame comprises a support area supporting the sealing member along a circumferential direction of the sealing member, and the support area comprises:

a first support surface inclined in a height direction of the housing from the front surface toward the rear surface of the housing; and a second support surface extending from the first support surface to form a first inclination angle with the first support surface.

17. The electronic device of claim 16, wherein, based on a state in which a load of the PCB and the sound module is exerted on the front frame, the load of the PCB and the sound module is distributed to and exerted on each of the first support surface and the second support surface.

18. The electronic device of claim 16, wherein the sealing member comprises:

an attachment surface attached to the second board surface;

a first sealing surface disposed on the first support surface; and a second sealing surface extending from the first sealing surface to form a second inclination angle with the first sealing surface, and disposed on the second support surface.

19. The electronic device of claim 18, wherein an inclination formed by the first sealing surface and the second sealing surface has a shape corresponding to an inclination formed by the first support surface and the second support surface.

20. An electronic device comprising:

a housing forming a front surface, a rear surface to be opposite to the front surface, and a side surface surrounding an internal space between the front surface and the rear surface, and comprising a front frame which is disposed in the internal space and forms at least a portion of the side surface, and on which a sound hole for transferring a sound from an outside of the electronic device to the internal space, and an acoustic duct communicating with the sound hole are formed;

a printed circuit board (PCB) which is supported by the front frame and comprises a first board surface, a second board surface opposite to the first board surface, and an opening formed to penetrate the first board surface and the second board surface to overlap the acoustic duct;

a sound module electrically connected to the PCB and comprising a microphone disposed on the first board surface to overlap the opening; and a sealing member, comprising seal material, that seals a portion between the front frame and the PCB, and is configured to transfer a sound between at least the acoustic duct and the opening, and has an inclined shape based on a state in which the second board surface is viewed, wherein the front frame comprises a support area supporting the sealing member along a circumferential direction of the sealing member, the support area comprises:

a first support surface formed to be inclined in a height direction of the housing from the front surface toward the rear surface of the housing; and a second support surface formed to extend from the first support surface to form a first inclination angle with the first support surface, and the sealing member comprises:

an attachment surface attached to the second board surface;

a first sealing surface disposed on the first support surface with an inclination parallel to the first support surface; and a second sealing surface formed to extend from the first sealing surface to form a second inclination angle, that is substantially the same as the first inclination angle, with the first sealing surface, and disposed on the second support surface with an inclination parallel to the second support surface.

* * * * *